US012571731B2

(12) United States Patent
Shimizu et al.

(10) Patent No.: US 12,571,731 B2
(45) Date of Patent: Mar. 10, 2026

(54) BIOLOGICAL SAMPLE ANALYZER AND FLOW CYTOMETER

(71) Applicant: Sony Group Corporation, Tokyo (JP)

(72) Inventors: Tatsuo Shimizu, Chiba (JP); Yoshiki Okamoto, Kanagawa (JP); Takamichi Yamakoshi, Tokyo (JP)

(73) Assignee: Sony Group Corporation, Tokyo (JP)

( * ) Notice: Subject to any disclaimer, the term of this patent is extended or adjusted under 35 U.S.C. 154(b) by 192 days.

(21) Appl. No.: 18/282,607

(22) PCT Filed: Feb. 22, 2022

(86) PCT No.: PCT/JP2022/007168
§ 371 (c)(1),
(2) Date: Sep. 18, 2023

(87) PCT Pub. No.: WO2022/202054
PCT Pub. Date: Sep. 29, 2022

(65) Prior Publication Data
US 2024/0159670 A1 May 16, 2024

(30) Foreign Application Priority Data

Mar. 26, 2021 (JP) ................................. 2021-053229

(51) Int. Cl.
*G01N 21/47* (2006.01)
*G01N 15/1429* (2024.01)
*H10F 30/225* (2025.01)
(52) U.S. Cl.
CPC ......... *G01N 21/47* (2013.01); *G01N 15/1431* (2013.01); *H10F 30/225* (2025.01)

(58) Field of Classification Search
CPC ....... G01N 15/1459; G01N 2015/1006; G01N 15/1434; G01N 15/1436; G01N 15/14;
(Continued)

(56) References Cited

U.S. PATENT DOCUMENTS 5,543,612 A 8/1996 Kanaya et al.
6,483,589 B1 11/2002 Suzuki et al.
(Continued)

FOREIGN PATENT DOCUMENTS

CN 205562378 U 9/2016
JP 2001-021493 A 1/2001
(Continued)

OTHER PUBLICATIONS

International Search Report and English translation thereof mailed May 17, 2022 in connection with International Application No. PCT/JP2022/007168.

*Primary Examiner* — Michael P Stafira
(74) *Attorney, Agent, or Firm* — Wolf, Greenfield & Sacks, P.C.

(57) ABSTRACT

A dynamic range is extended while suppressing an increase in a chip area.
A biological sample analyzer of the present disclosure includes: a first semiconductor photodetection element that detects first light generated by irradiation of a biological sample and generates a first signal; a second semiconductor photodetection element that detects second light reflected by the first semiconductor photodetection element among the first light and generates a second signal; and a processing circuit that acquires information regarding the first light on the basis of the first signal and the first signal.

19 Claims, 15 Drawing Sheets

(58) Field of Classification Search

CPC ......... G01N 15/147; G01N 2015/1486; G01N 15/149; G01N 15/01; G01N 2015/1452; G01N 21/6428; G01N 2015/1493; G01N 15/1404; G01N 2021/6439; G01N 2015/144; G01N 2015/1488; G01N 2021/6441; G01N 33/56983; G01N 33/582; G01N 21/645; G01N 15/06; G01N 15/075; G01N 15/1433; G01N 2015/0687; G01N 2015/1497; G01N 2333/11; G01N 2469/10; G01N 33/533; G01N 21/05; G01N 2015/1438; G01N 15/1484; G01N 15/1429; G01N 15/1012; G01N 2021/6482; G01N 2015/1027; G01N 21/01; G01N 2015/1447; G01N 2021/0112; G01N 2015/1014; G01N 2015/1016; G01N 2015/1443; G01N 21/27; G01N 21/53; G01N 1/30; G01N 15/1409; G01N 15/1425; G01N 2015/019; G01N 21/6486; G01N 15/00; G01N 2021/4711; G01N 2021/06113; G01N 2201/062; G01N 2201/068; G01N 2201/08; G01N 2001/302; G01N 2015/012; G01N 2021/4707; G01N 21/51; G01N 21/85; G01N 2201/0415; G01N 15/1492; G01N 2015/0288; G01N 21/274; G01N 21/6408; G01N 21/6458; G01N 2333/01; G01N 2333/08; G01N 33/4915; G01N 2015/016; G01N 2021/6421; G01N 21/4795; G01N 2201/0245; G01N 33/574; G01N 15/1427; G01N 15/1456; G01N 2015/018; G01N 2015/1413; G01N 2015/1477; G01N 2021/6471; G01N 21/0303; G01N 33/56966; G01N 1/2211; G01N 15/0205; G01N 15/1431; G01N 2015/0038; G01N 2015/0261; G01N 2015/1472; G01N 21/25; G01N 2201/0225; G01N 2201/0228; G01N 2223/419; G01N 23/046; G01N 15/1468; G01N 2015/011; G01N 2015/0294; G01N 2015/1406; G01N 2015/1479; G01N 33/49; G01N 33/58; G01N 35/00603; G01N 35/00663; G01N 15/0211; G01N 2015/1445; G01N 2015/1481; G01N 2035/00148; G01N 2035/00237; G01N 2035/00247; G01N 2035/1034; G01N 2035/1039; G01N 2035/1041; G01N 2035/1053; G01N 21/31; G01N 21/4788; G01N 21/49; G01N 21/6456; G01N 2201/061; G01N 2291/02433; G01N 2291/02836; G01N 2291/02872; G01N 29/032; G01N 33/50; G01N 33/5091; G01N 33/54346; G01N 33/54366; G01N 33/70; G01N 33/728; G01N 33/84; G01N 33/92; G01N 35/08; G01N 15/1023; G01N 2015/03; G01N 2015/1019; G01N 2015/139; G01N 2015/1402; G01N 2021/0307; G01N 2021/0392; G01N 2021/052; G01N 2021/1772; G01N 2021/1787; G01N 2021/5919; G01N 2021/5923; G01N 2021/5957; G01N 21/17; G01N 2201/024; G01N 2201/0696; G01N 33/48771; G01N 33/5005; G01N 33/52; G01N 15/0806; G01N 15/12; G01N 2015/0046; G01N 2015/0238; G01N 2015/0846; G01N 2015/1024; G01N 2015/1029; G01N 2021/0325; G01N 2021/0346; G01N 2021/651; G01N 2035/00158; G01N 2035/00326; G01N 2035/00346; G01N 2035/00881; G01N 2035/00891; G01N 21/278; G01N 21/47; G01N 21/532; G01N 21/66; G01N 21/69; G01N 21/76; G01N 21/8507; G01N 2201/1045; G01N 2500/10; G01N 27/44726; G01N 33/1886; G01N 33/483; G01N 33/491; G01N 33/5008; G01N 33/502; G01N 33/5026; G01N 3/5044; G01N 33/5094; G01N 33/5302; G01N 35/00069; G01N 35/00722; G01N 35/085; G01N 35/1095

See application file for complete search history.

(56)      References Cited

U.S. PATENT DOCUMENTS

| | | | |
|---|---|---|---|
| 2010/0079762 A1* | 4/2010 | Kusuzawa | ......... G01N 15/1425 |
| | | | 356/442 |
| 2012/0016616 A1 | 1/2012 | Kato et al. | |
| 2014/0374622 A1 | 12/2014 | Cronin et al. | |
| 2021/0247293 A1* | 8/2021 | Ilkov | ................. G01N 15/1434 |
| 2021/0258517 A1 | 8/2021 | Reshetouski et al. | |
| 2021/0331172 A1 | 10/2021 | Ito et al. | |

FOREIGN PATENT DOCUMENTS

| | | | | | |
|---|---|---|---|---|---|
| JP | 3343680 | B2 | * | 11/2002 | |
| JP | 2011-232259 | A | | 11/2011 | |
| JP | 2012-078098 | A | | 4/2012 | |
| JP | 2015-508494 | A | | 3/2015 | |
| JP | 2019-012270 | A | | 1/2019 | |
| JP | 2020-076736 | A | | 5/2020 | |
| JP | 2023513217 | A | * | 3/2023 | ........... G02B 27/145 |
| WO | WO-2013093035 | A1 | * | 6/2013 | ........... G01J 1/0418 |
| WO | 2020/079960 | A1 | | 4/2020 | |

* cited by examiner

START

S1401  FIRST SEMICONDUCTOR PHOTODETECTION ELEMENT RECEIVES INCIDENT LIGHT

S1402  FIRST SEMICONDUCTOR PHOTODETECTION ELEMENT REFLECTS INCIDENT LIGHT

S1403  SECOND SEMICONDUCTOR PHOTODETECTION ELEMENT RECEIVES REFLECTED LIGHT OF FIRST SEMICONDUCTOR ELEMENT

S1404  PERFORM ADDITION PROCESSING

S1405  ANALYZE INCIDENT LIGHT INFORMATION

END

BIOLOGICAL SAMPLE ANALYZER AND FLOW CYTOMETER

CROSS-REFERENCE TO RELATED APPLICATIONS

This application claims the benefit under 35 U.S.C. § 371 as a U.S. National Stage Entry of International Application No. PCT/JP2022/007168, filed in the Japanese Patent Office as a Receiving Office on Feb. 22, 2022, which claims priority to Japanese Patent Application Number JP2021-053229, filed in the Japanese Patent Office on Mar. 26, 2021, each of which is hereby incorporated by reference in its entirety.

TECHNICAL FIELD

The present disclosure relates to a biological sample analyzer and a flow cytometer.

BACKGROUND ART

A semiconductor photodetection element (photodetector) is known in which minute elements for detecting light are laid as pixels on a substrate. Such a photodetector is called a pixelated photodetector (PPD). Silicon photo-multiplier (SiPM) and multi-pixel photon counter (MPPC) are known as examples of the PPD.

The pixel of such a semiconductor photodetection element usually includes a photodiode. In particular, in a case where the photodiode includes an Avalanche photodiode (APD), the photodiode can be operated in a Geiger mode in which single photon detection is possible when a reverse voltage exceeding a breakdown voltage is applied to the APD.

However, in the semiconductor photodetection element operating in such a Geiger mode, the dynamic range (DR) is determined by the number of pixels. Therefore, there is a problem that the dynamic range is insufficient for use in applications with a wide dynamic range from dark particles to bright particles such as a flow cytometer. Furthermore, compared to a photomultiplier tube (PMT), a range in which the light receiving sensitivity can be adjusted is narrow, so there is a problem that extremely bright particles cannot be dealt with.

Although the dynamic range can be widened by increasing the number of pixels, it is necessary to increase the number of pixels while maintaining the pixel size in order to maintain the quantum efficiency.

However, when the number of pixels is increased while maintaining the pixel size, there is a problem that a chip area (element size) increases in proportion to the number of pixels and the cost increases. Furthermore, since it is necessary to increase a beam diameter to be irradiated in order to deal with the increased element size, there is a problem that an optical system becomes large.

CITATION LIST

Patent Document

Patent Document 1: Japanese Patent Application Laid-Open No. 2015-508494
Patent Document 2: Japanese Patent Application Laid-Open No. 2011-232259

Patent Document 3: Japanese Patent Application Laid-Open No. 2020-76736

SUMMARY OF THE INVENTION

Problems to be Solved by the Invention

The present disclosure has been made in view of the above-described problems, and an object thereof is to extend a dynamic range while suppressing an increase in a chip area.

Solution to Problems

A biological sample analyzer of the present disclosure includes: a first semiconductor photodetection element that detects first light generated by irradiation of a biological sample and generates a first signal; a second semiconductor photodetection element that detects second light reflected by the first semiconductor photodetection element among the first light and generates a second signal; and a processing circuit that acquires information regarding the first light on the basis of the first signal and the second signal.

BRIEF DESCRIPTION OF DRAWINGS

FIG. 4 is a view illustrating an arrangement example of a plurality of the light receiving elements according to the embodiment of the present disclosure.

FIG. 8 is a block diagram illustrating another example of the processing circuit according to the embodiment of the present disclosure.

FIG. 11 is a block diagram illustrating still another example of the processing circuit according to the embodiment of the present disclosure.

MODE FOR CARRYING OUT THE INVENTION

1. Assumed Representative Scenario

Figure 1:
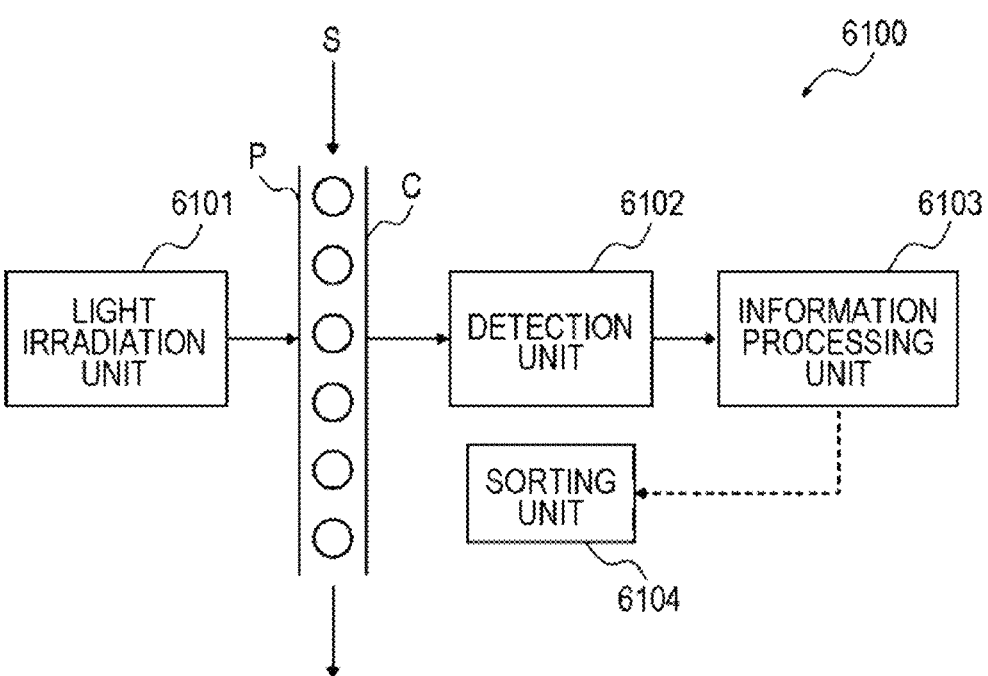
FIG. 1 is a block diagram of a flow cytometer according to the present disclosure.

FIG. 1 illustrates a configuration example of a biological sample analyzer of the present disclosure. A biological sample analyzer 6100 illustrated in FIG. 1 includes a light irradiation unit 6101 that irradiates a biological sample S flowing through a channel C with light, a detection unit 6102 that detects light generated by irradiating the biological sample S with light, and an information processing unit 6103 that processes information regarding the light detected by the detection unit. The biological sample analyzer 6100 is a flow cytometer or an imaging cytometer, for example. The biological sample analyzer 6100 may include a sorting unit 6104 that sorts out specific biological particles P in a biological sample. The biological sample analyzer 6100 including the sorting unit is a cell sorter, for example.

(Biological Sample)

The biological sample S may be a liquid sample containing biological particles. The biological particles are cells or non-cellular biological particles, for example. The cells may be living cells, and more specific examples thereof include blood cells such as erythrocytes and leukocytes, and germ cells such as sperms and fertilized eggs. Also, the cells may be those directly collected from a sample such as whole blood, or may be cultured cells obtained after culturing. The non-cellular biological particles are extracellular vesicles, or particularly, exosomes and microvesicles, for example. The biological particles may be labeled with one or more labeling substances (such as a dye (particularly, a fluorescent dye) and a fluorochrome-labeled antibody). Note that particles other than biological particles may be analyzed by the biological sample analyzer of the present disclosure, and beads or the like may be analyzed for calibration or the like.

(Flow Channel)

The flow channel C is designed so that a flow of the biological sample S is formed. In particular, the flow channel C may be designed so that a flow in which the biological particles contained in the biological sample are aligned substantially in one row is formed. The flow channel structure including the flow channel C may be designed so that a laminar flow is formed. In particular, the flow channel structure is designed so that a laminar flow in which the flow of the biological sample (a sample flow) is surrounded by the flow of a sheath liquid is formed. The design of the flow channel structure may be appropriately selected by a person skilled in the art, or a known one may be adopted. The flow channel C may be formed in a flow channel structure such as a microchip (a chip having a flow channel on the order of micrometers) or a flow cell. The width of the flow channel C is 1 mm or smaller, or particularly, may be not smaller than 10 μm and not greater than 1 mm. The flow channel C and the flow channel structure including the flow channel C may be made of a material such as plastic or glass.

The biological sample analyzer of the present disclosure is designed so that the biological sample flowing in the flow channel C, or particularly, the biological particles in the biological sample are irradiated with light from the light irradiation unit 6101. The biological sample analyzer of the present disclosure may be designed so that the irradiation point of light on the biological sample is located in the flow channel structure in which the flow channel C is formed, or may be designed so that the irradiation point is located outside the flow channel structure. An example of the former case may be a configuration in which the light is emitted onto the flow channel C in a microchip or a flow cell. In the latter case, the biological particles after exiting the flow channel structure (particularly, the nozzle portion thereof) may be irradiated with the light, and a flow cytometer of a jet-in-air type can be adopted, for example.

(Light Irradiation Unit)

The light irradiation unit 6101 includes a light source unit that emits light, and a light guide optical system that guides the light to the irradiation point. The light source unit includes one or more light sources. The type of the light source(s) is a laser light source or an LED, for example. The wavelength of light to be emitted from each light source may be any wavelength of ultraviolet light, visible light, and infrared light. The light guide optical system includes optical components such as beam splitters, mirrors, or optical fibers, for example. The light guide optical system may also include a lens group for condensing light, and includes an objective lens, for example. There may be one or more irradiation points at which the biological sample and light intersect. The light irradiation unit 6101 may be designed to collect light emitted onto one irradiation point from one light source or different light sources.

(Detection Unit)

The detection unit 6102 includes at least one photodetector that detects light generated by emitting light onto biological particles. The light to be detected may be fluorescence or scattered light (such as one or more of the following: forward scattered light, backscattered light, and side scattered light), for example. Each photodetector includes one or more light receiving elements, and has a light receiving element array, for example. Each photodetector may include one or more photomultiplier tubes (PMTs) and/or photodiodes such as APDs and MPPCs, as the light receiving elements. The photodetector includes a PMT array in which a plurality of PMTs is arranged in a one-dimensional direction, for example. The detection unit 6102 may also include an image sensor such as a CCD or a CMOS. With the image sensor, the detection unit 6102 can acquire an image (such as a bright-field image, a dark-field image, or a fluorescent image, for example) of biological particles.

The detection unit 6102 includes a detection optical system that causes light of a predetermined detection wavelength to reach the corresponding photodetector. The detection optical system includes a spectroscopic unit such as a prism or a diffraction grating, or a wavelength separation unit such as a dichroic mirror or an optical filter. The detection optical system is designed to disperse the light generated by light irradiation to biological particles, for example, and detect the dispersed light with a larger number of photodetectors than the number of fluorescent dyes with which the biological particles are labeled. A flow cytometer including such a detection optical system is called a spectral flow cytometer. Further, the detection optical system is designed to separate the light corresponding to the fluorescence wavelength band of a specific fluorescent dye from the light generated by the light irradiation to the biological particles, for example, and cause the corresponding photodetector to detect the separated light.

The detection unit 6102 may also include a signal processing unit that converts an electrical signal obtained by a photodetector into a digital signal. The signal processing unit may include an A/D converter as a device that performs the conversion. The digital signal obtained by the conversion performed by the signal processing unit can be transmitted to the information processing unit 6103. The digital signal can be handled as data related to light (hereinafter, also referred to as "light data") by the information processing unit 6103. The light data may be light data including fluorescence data, for example. More specifically, the light data may be data of light intensity, and the light intensity may be light intensity data of light including fluorescence (the light intensity data may include feature quantities such as area, height, and width).

(Information Processing Unit)

The information processing unit 6103 includes a processing unit that performs processing of various kinds of data (light data, for example), and a storage unit that stores various kinds of data, for example. In a case where the processing unit acquires the light data corresponding to a fluorescent dye from the detection unit 6102, the processing unit can perform fluorescence leakage correction (a compensation process) on the light intensity data. In the case of a spectral flow cytometer, the processing unit also performs a fluorescence separation process on the light data, and acquires the light intensity data corresponding to the fluorescent dye. The fluorescence separation process may be performed by an unmixing method disclosed in JP 2011-232259 A, for example. In a case where the detection unit 6102 includes an image sensor, the processing unit may acquire morphological information about the biological particles, on the basis of an image acquired by the image sensor. The storage unit may be designed to be capable of storing the acquired light data. The storage unit may be designed to be capable of further storing spectral reference data to be used in the unmixing process.

In a case where the biological sample analyzer 6100 includes the sorting unit 6104 described later, the information processing unit 6103 can determine whether to sort the biological particles, on the basis of the light data and/or the morphological information. The information processing unit 6103 then controls the sorting unit 6104 on the basis of the result of the determination, and the biological particles can be sorted by the sorting unit 6104.

The information processing unit 6103 may be designed to be capable of outputting various kinds of data (such as light data and images, for example). For example, the information processing unit 6103 can output various kinds of data (such as a two-dimensional plot or a spectrum plot, for example) generated on the basis of the light data. The information processing unit 6103 may also be designed to be capable of accepting inputs of various kinds of data, and accepts a gating process on a plot by a user, for example. The information processing unit 6103 may include an output unit (such as a display, for example) or an input unit (such as a keyboard, for example) for performing the output or the input.

The information processing unit 6103 may be designed as a general-purpose computer, and may be designed as an information processing device that includes a CPU, a RAM, and a ROM, for example. The information processing unit 6103 may be included in the housing in which the light irradiation unit 6101 and the detection unit 6102 are included, or may be located outside the housing. Further, the various processes or functions to be executed by the information processing unit 6103 may be realized by a server computer or a cloud connected via a network.

(Sorting Unit)

The sorting unit 6104 performs sorting of biological particles, in accordance with the result of determination performed by the information processing unit 6103. The sorting method may be a method by which droplets containing biological particles are generated by vibration, electric charges are applied to the droplets to be sorted, and the traveling direction of the droplets is controlled by an electrode. The sorting method may be a method for sorting by controlling the traveling direction of biological particles in the flow channel structure. The flow channel structure has a control mechanism based on pressure (injection or suction) or electric charge, for example. Examples of the flow channel structure include a chip (for example, a chip described in Japanese Patent Application Laid-Open No. 2020-76736) having a flow channel structure in which the flow channel C branches into a collection flow channel and a waste liquid flow channel on a downstream side thereof, and a specific biological particle is collected into the collection flow channel.

2. Embodiments of Present Invention

Figure 2:
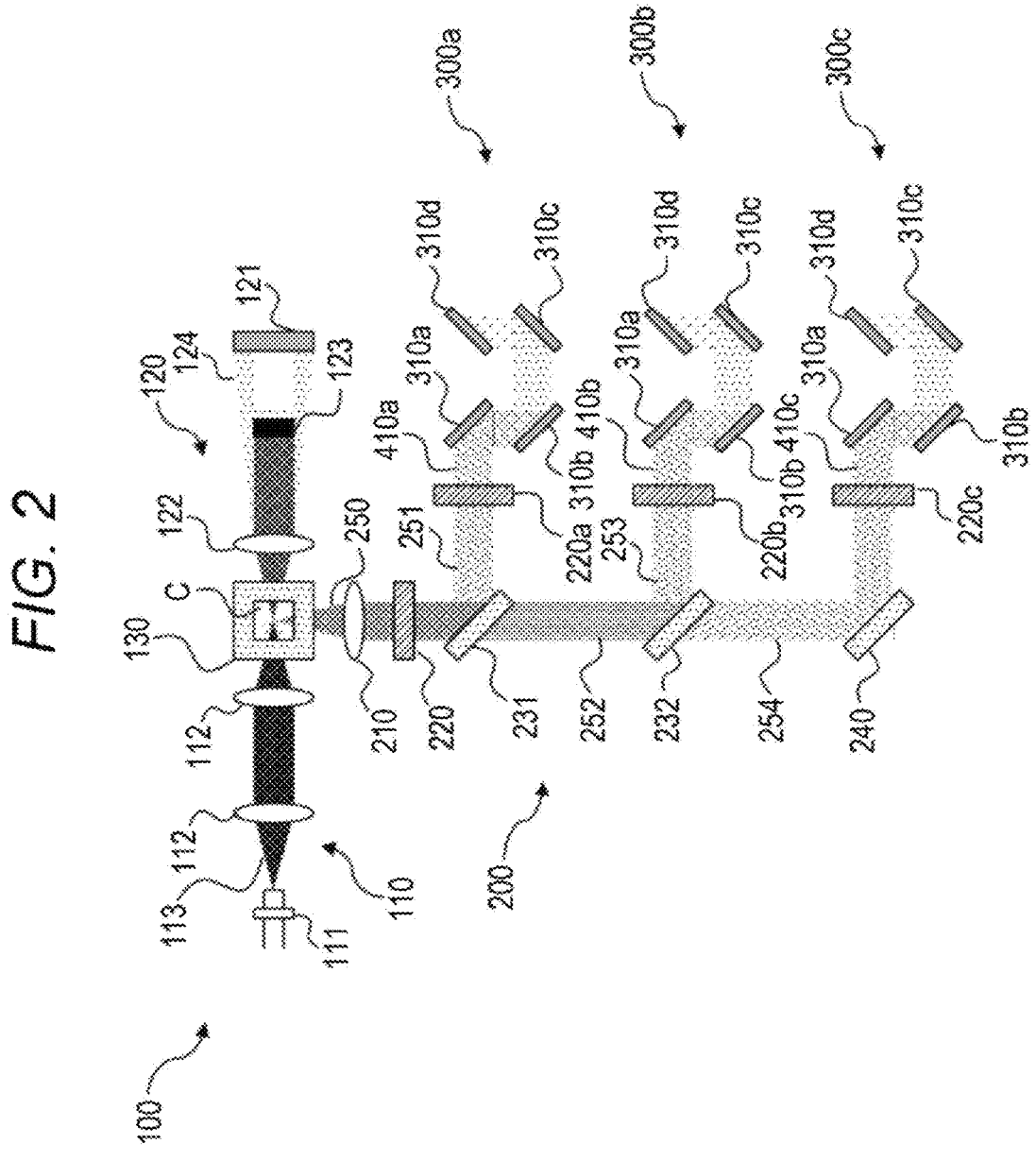
FIG. 2 is a configuration diagram of a flow cytometer according to an embodiment of the present disclosure.

FIG. 2 illustrates a configuration example of a flow cytometer 100 which is an embodiment of the biological sample analyzer of the present disclosure. A flow cytometer 100 illustrated in FIG. 2 includes a light irradiation unit 110 that irradiates a biological sample S flowing through a flow channel C with light, a scattered light detection unit 120 that detects scattered light among light generated by irradiating the biological sample S with light, a fluorescence detection unit 200 that detects fluorescence among light generated by irradiating the biological sample S with light, a processing circuit (not illustrated), and a flow cell 130 constituting the flow channel C. The processing circuit corresponds to the information processing unit 6103 in FIG. 1 as an example.

The light irradiation unit 110 of the present embodiment irradiates the biological sample S flowing through the flow channel C with light. The light irradiation unit 110 includes a laser diode 111 as a light source and a plurality of lenses 112 as a light guide optical system. The light irradiation unit 110 condenses a laser light 113 emitted by the laser diode 111 by the plurality of lenses 112, and emits the laser light 113 toward an irradiation point inside the flow cell 130.

The scattered light detection unit 120 detects scattered light generated by irradiating the biological particles with light. The scattered light detection unit 120 detects forward scattered light. A detection unit that detects scattered light in other directions such as side scattered light may be provided to detect scattered light in other directions such as side scattered light.

The scattered light detection unit 120 includes a photodiode 121 as a light receiving element. The scattered light detection unit 120 includes a plurality of lenses 122 as a detection optical system. Furthermore, the scattered light detection unit 120 includes an optical mask 123 as a spectroscopic unit that is a part of the detection optical system.

The scattered light detection unit 120 causes the plurality of lenses 122 to condense forward scattered light 124 generated by irradiating the biological sample S with the laser light 113 emitted by the light irradiation unit 110. Then, the scattered light detection unit 120 blocks the light directly transmitted among the condensed light by the optical mask 123, and causes only the forward scattered light 124 scattered by the biological sample S to be incident on the photodiode 121. The photodiode 121 detects the incident forward scattered light 124.

The fluorescence detection unit 200 of the present embodiment is a detection unit that detects fluorescence generated by irradiating the biological particles with light.

The fluorescence detection unit 200 includes light receiving units 300a, 300b, and 300c. An arbitrary light receiving unit will be referred to as a light receiving unit 300. The fluorescence detection unit 200 includes dichroic mirrors 231 and 232 and a mirror 240 as the detection optical system. Furthermore, a low pass filter (hereinafter referred to as LPF) 220 and band pass filters (hereinafter referred to as BPF) 220a, 220b, and 220c are included as a spectroscopic unit that is a part of the detection optical system.

The light receiving units 300a, 300b, and 300c detect light of different wavelengths as a detection target. As a result, different items can be analyzed for the same cell to be tested. In the present embodiment, the number of the light receiving units 300 is three, but the number of the light receiving units 300 may be any number as long as it is one or more.

The light receiving unit 300a receives fluorescent light 251 dispersed by the dichroic mirror 231 as incident light 410a. The light receiving unit 300b receives fluorescent light 253 dispersed by the dichroic mirror 232 as incident light 410b. The light receiving unit 300c receives the light reflected by the mirror 240 as incident light 410c.

In the fluorescence detection unit 200, fluorescence 250 generated by irradiating the biological sample S with the laser light 113 emitted by the light irradiation unit 110 is condensed by the lens 210, and spectrally dispersed into light having a wavelength corresponding to the light receiving unit 300a by the LPF 220 and the dichroic mirror 231. The dichroic mirror 231 detects the target fluorescence 251 and spectrally disperses the fluorescence to the BPF 220a, and spectrally disperses non-target fluorescence 252 to the dichroic mirror 232 of the light receiving unit 300b in the next stage. The dichroic mirror 232 detects target fluorescence 253 and spectrally disperses the detected fluorescence into the LBF 220b, and spectrally disperses non-target fluorescence 254 into the mirror 240 having no spectral function. The fluorescence 254 reflected by the mirror 240 is dispersed into BPF 220c.

As described above, the light receiving unit 300 (300a to 300c) is a part of the fluorescence detection unit 200, and is a part that actually detects fluorescence generated by irradiating the biological particles with light. The light receiving unit 300 includes four light receiving elements 310a, 310b, 310c, and 310d that are semiconductor photodetection elements. An arbitrary one light receiving element is referred to as a light receiving element 310. In FIG. 2, the four light receiving elements included in each of the light receiving units 300a to 300c are denoted by the same reference signs. Here, when a detection surface (incident surface) is irradiated with light, the four light receiving elements detect light by outputting a signal indicating a current corresponding to the intensity of the irradiated light. The operation of the light receiving units 300a to 300c differs only in the wavelength of the target fluorescent light, and the basic configuration and operation are the same. Therefore, the light receiving unit 300a will be described below as an example.

The light receiving unit 300a includes the four light receiving elements 310a, 310b, 310c, and 310d. The light receiving element 310a detects the incident light 410a and generates a signal corresponding to the intensity of the detected light. Light reflected by a surface of the light receiving element 310a is incident on the light receiving element 310b, and the incident light is detected. The light receiving element 310b generates a signal corresponding to the intensity of the detected light. Light reflected on a surface of the light receiving element 310b is incident on the light receiving element 310c, and the incident light is detected. The light receiving element 310c generates a signal corresponding to the intensity of the detected light. Light reflected by a surface of the light receiving element 310c is incident on the light receiving element 310d, and the incident light is detected. The light receiving element 310d generates a signal corresponding to the intensity of the detected light. As described above, each of the light receiving elements 310b, 310c, and 310d is disposed in a direction in which the light incident from the light receiving element in the preceding stage is reflected in a direction different from the incident direction. As a result, the light reflected by the first light receiving element 310a is reflected by the light receiving elements 310b and 310c while sequentially decreasing the intensity, and finally reaches the light receiving element 310d. The signals generated by the light receiving elements 310a to 310d are sent to a processing circuit, and the processing circuit acquires information regarding the fluorescence 251 or the incident light 410a. Since the reflectance of each of the light receiving elements 310a to 310d is smaller than 1, the intensity of the reflected light decreases as the reflection is repeated. Even in a case where the intensity of the incident light 410a is high and the light receiving element 310a is saturated, there is a low possibility that the light receiving element at the subsequent stage is not saturated or saturated. Therefore, by using the signals detected by the light receiving elements 310b to 310d, the information regarding the fluorescence 251 or the incident light 410a can be acquired with high accuracy (details will be described later). That is, the light receiving unit can be made sensitive to light having a wide dynamic range, and the dynamic range of the light receiving unit can be increased. Furthermore, the dynamic range can be exponentially increased by increasing the number of stages of the light receiving elements.

Next, a structure of the light receiving element 310 will be described.

Figure 3:
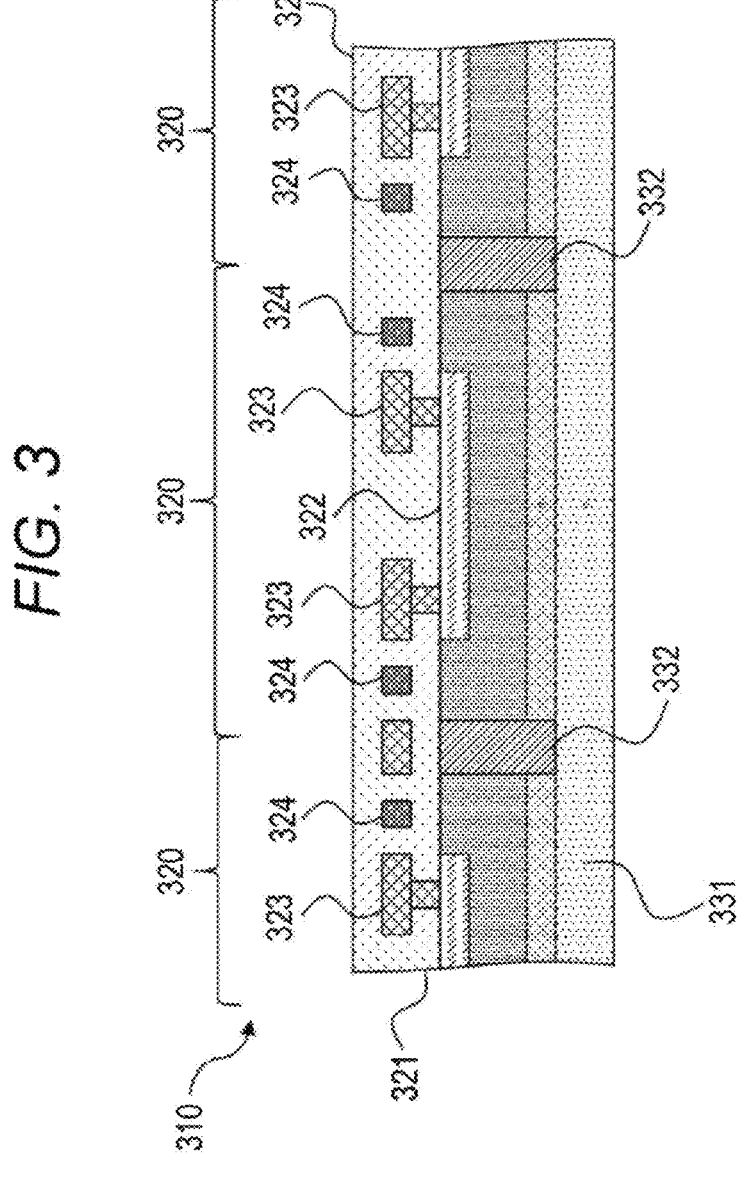
FIG. 3 is a schematic cross-sectional view of a light receiving element according to the embodiment of the present disclosure.

FIG. 3 is a schematic cross-sectional view of the light receiving element 310 according to the embodiment of the present disclosure.

The light receiving element 310 includes a plurality of photodiodes arranged in a matrix.

A plurality of light detection channels 320 is formed on a semiconductor substrate 331. The plurality of light detection channels 320 is electrically separated by a separation unit 332 which is an element separation film. The separation unit 332 is an insulator, and prevents a current generated in each of the light detection channels 320 on the semiconductor substrate 331 from flowing to another light detection channel 320.

The light detection channel 320 generates a current corresponding to the emitted light, and outputs the generated current. The currents output from the respective light detection channels 320 are combined, and a signal indicating the combined current is supplied to the processing circuit. The light detection channel 320 includes a protective film 321, a light detection layer 322, a metal wiring 323, and a polyresistor 324.

The protective film 321 covers other components (the light detection layer 322, the metal wiring 323, and the polyresistor 324) of the light detection channel 320 or the semiconductor substrate 331 to protect the components. A part of the emitted light can be reflected by the protective film 321, the light detection layer 322, the metal wiring 323, and the polyresistor 324.

The light detection layer 322 is a photodiode that detects the emitted light. As an example, the light detection layer 322 is an avalanche photodiode that operates in a Geiger mode. When irradiated with light, the light detection layer 322 detects the light and generates a current by a mechanism in which an electron avalanche occurs inside.

The current generated in the light detection layer 322 is output through the metal wiring 323. The currents output from the respective light detection layers 322 are combined, and a signal indicating the combined current is supplied to the processing circuit. The combining may be performed at a node where a plurality of the metal wirings 323 merge, or a combining circuit may be provided.

Figure 4:
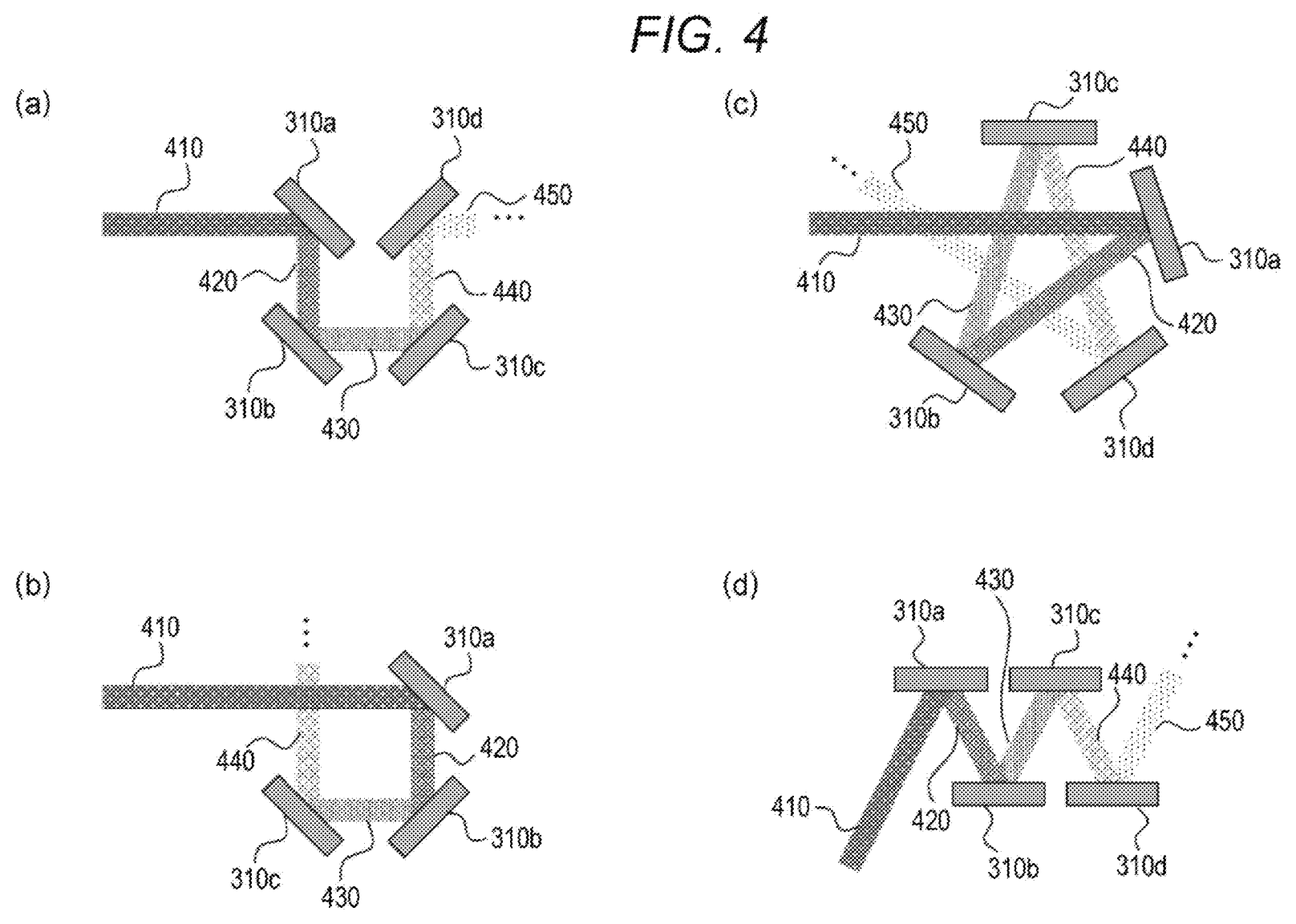

FIGS. 4(*a*) to 4(*d*) are diagrams illustrating arrangement examples of the plurality of light receiving elements 310 in the light receiving unit 300 according to the embodiment of the present disclosure.

In the arrangement example of FIG. 4(*a*), the light receiving elements 310*a* to 310*d* are arranged at positions corresponding to respective vertexes of a substantially rectangular shape.

Incident light 410 first enters the light receiving element 310*a*. The light receiving element 310*a* detects a part of the incident light 410 and reflects the remaining part as reflected light 420, and the reflected light 420 is incident on the light receiving element 310*b*. The reflected light 420 is not parallel to a direction of the incident light 410. The light receiving element 310*b* detects a part of the incident light and reflects the remaining part as reflected light 430. The reflected light 430 is not parallel to a direction of the incident light on the light receiving element 310*b*. The reflected light 430 from the light receiving element 310*b* is incident on the light receiving element 310*c*. The light receiving element 310*c* detects a part of the incident light and reflects the remaining part as reflected light 440. The reflected light 440 is not parallel to a direction of the incident light on the light receiving element 310*c*. The reflected light 440 from the light receiving element 310*c* is incident on the light receiving element 310*d*, and a part or all of the incident light is detected by the light receiving element 310*d*. The light detected by the light receiving elements 310*a* to 310*d* is converted into a current, then combined, and a signal indicating the combined current is supplied to the processing circuit. Reflectance of the light receiving elements 310*a* to 310*d* is smaller than 1, and intensity of the incident light 410, the reflected light 420, the reflected light 430, the reflected light 440, and reflected light 450 decreases in this order. As the light receiving element goes to the subsequent stage, the light receiving element is not saturated or is less likely to be saturated. Therefore, the light receiving element at the subsequent stage has sensitivity to light having a wide dynamic range.

In the arrangement example of FIG. 4(*b*), three light receiving elements 310 (310*a*, 310*b*, and 310*c*) are arranged. Similarly to FIG. 4(*a*), they are arranged at positions corresponding to three vertexes of a substantially rectangular shape. In the arrangement of FIG. 4(*b*), a path for reflecting the incident light is different from that in FIG. 4(*a*).

Incident light 410 first enters the light receiving element 310*a*. The light receiving element 310*a* detects a part of the incident light 410 and reflects the remaining part, and the reflected light 420 is incident on the light receiving element 310*b*. The light receiving element 310*b* detects a part of the incident light and reflects the remaining part. The reflected light 430 from the light receiving element 310*b* is incident on the light receiving element 310*c*. The light receiving element 310*c* detects a part or all of the incident light. The operation after detection by each light receiving element is similar to that in FIG. 4(*a*). Also in the arrangement of FIG. 4(*b*), the light receiving element is not saturated or is less likely to be saturated toward the subsequent stage, and thus the light receiving element at the subsequent stage is more sensitive to light in a wide dynamic range.

In the arrangement example of FIG. 4(*c*), the four light receiving elements 310 (310*a*, 310*b*, 310*c*, and 310*d*) are arranged at positions corresponding to four of the vertices of the substantially pentagon. The operation is similar to that in FIG. 4(*a*) except that a path for reflecting the incident light is different from that in FIG. 4(*a*), and thus the description thereof is omitted.

In the arrangement example of FIG. 4(*d*), the four light receiving elements 310 (310*a*, 310*b*, 310*c*, 310*d*) are shifted by a certain distance so as to face each other along the horizontal direction. The operation is similar to that in FIG. 4(*a*) except that the reflection path of the incident light is different from that in FIG. 4(*a*), and thus the description thereof is omitted.

Which arrangement example of FIGS. 4(*a*) to 4(*d*) is used may be determined according to the restriction of a device on which the light receiving element is mounted, or an arrangement example in which a desired effect can be obtained may be adopted. Furthermore, the arrangement examples illustrated in FIGS. 4(*a*) to 4(*d*) are merely examples, and various other arrangement examples are possible. The number of light receiving elements may be two or more, and is not limited to three or four illustrated in FIGS. 4(*a*) to 4(*d*).

In FIGS. 4(*a*) to 4(*d*), the plurality of light receiving elements 310 arranged may have the same detection sensitivity and dynamic range, or at least one of the detection sensitivity or the dynamic range may be different. For example, in the light receiving unit 300 of FIG. 4(*a*), a light receiving element having high detection sensitivity and a narrow dynamic range may be used as the light receiving element 310*a* of the first stage, and an element having low detection sensitivity but a wide dynamic range may be used toward the light receiving element of the subsequent stage. As a result, the dynamic range can be extended while increasing the detection sensitivity. Normally, the dynamic range of the light receiving element is wider as the number of pixels (the number of APDs in the example of the present embodiment) of the light receiving element is larger. Furthermore, the detection sensitivity of the light receiving element increases as an aperture ratio of the light receiving element increases.

Figure 5:
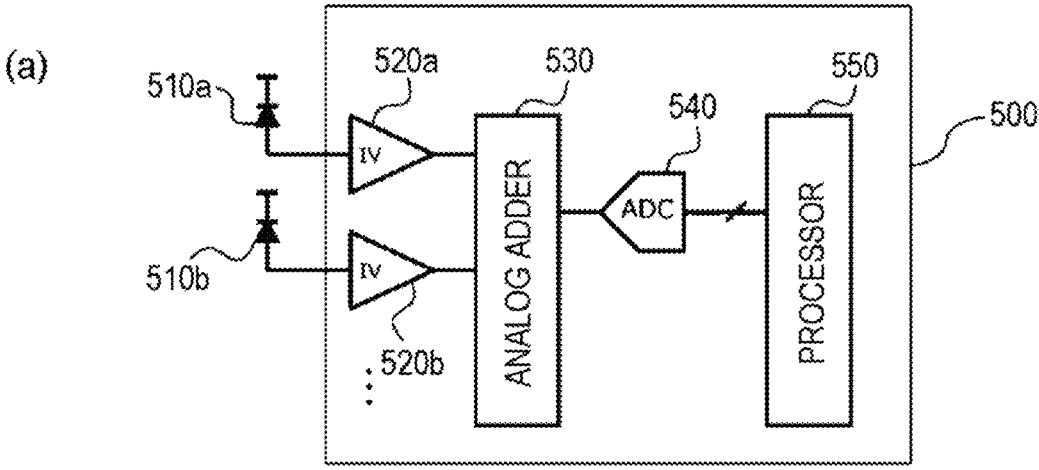
FIG. 5 is a block diagram illustrating an example of a processing circuit according to the embodiment of the present disclosure.
Figure 5:
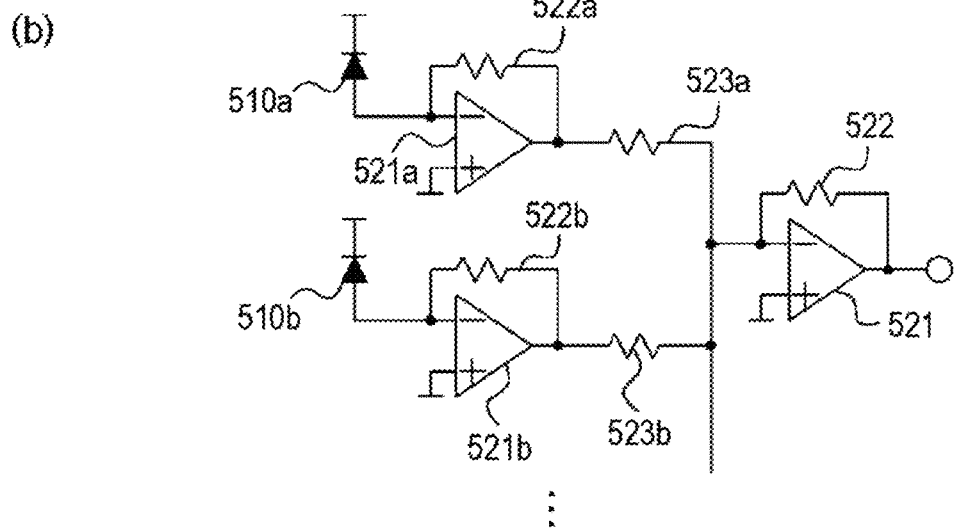

FIG. 5(*a*) is a block diagram illustrating a first example (analog addition method) of the processing circuit (information processing unit) in the flow cytometer 100 according to the embodiment of the present disclosure. A processing circuit 500 adds up the detection signals of the plurality of light receiving elements in an analog manner, and processes the added signal with the processor 550 to acquire information (for example, intensity of incident light) regarding the incident light on the light receiving unit 300. FIG. 5(*b*) is a circuit diagram of a part up to an analog adder 530 in the processing circuit 500 illustrated in FIG. 5(*a*).

In FIG. 5(*a*), two light receiving elements 510*a* and 510*b* are schematically illustrated using photodiode symbols. Here, the light receiving unit 300 includes the two light receiving elements 510*a* and 510*b*. The light receiving element 510*a* is a first-stage light receiving element, and the light receiving element 510*b* is a second-stage light receiving element (light reflected by the light receiving element 510*a* is incident). The processing circuit 500 includes IV amplifiers 520*a* and 520*b*, the analog adder 530, an analog-to-digital converter (ADC) 540, and the processor 550.

When detecting incident fluorescence, the light receiving elements 510*a* and 510*b* output currents that are analog signals. The output currents are input to the IV amplifiers 520*a* and 520*b*.

The IV amplifiers 520*a* and 520*b* convert the currents output from the light receiving elements 510*a* and 510*b* into voltage signals.

As illustrated in FIG. 5(b), the IV amplifier 520a includes an operational amplifier 521a and a resistor 522a. An inverting input terminal of the operational amplifier 521a is connected to an output terminal of the light receiving element 510a, and a non-inverting input terminal is connected to the ground. Furthermore, the resistor 522a is connected between the inverting input terminal of the operational amplifier 521a and the output terminal of the operational amplifier 521a. A resistor 523a is connected in series to an output side of the operational amplifier 521a.

Similarly to the IV amplifier 520a, the IV amplifier 520b also includes an operational amplifier 521b and a resistor 522b. The configuration of the IV amplifier 520b is similar to that of the IV amplifier 520a. That is, an inverting input terminal of the operational amplifier 521b is connected to an output terminal of the light receiving element 510b, and a non-inverting input terminal is connected to the ground. Furthermore, the resistor 522b is connected between the inverting input terminal of the operational amplifier 521b and the output terminal of the operational amplifier 521b. A resistor 523a is connected in series to an output side of the operational amplifier 521b.

Voltage signals from the IV amplifiers 520a and 520b are input to the analog adder 530. The analog adder 530 adds the input voltage signals and outputs the added signal (analog addition signal) to the analog to digital converter 540. The analog adder 530 includes the resistor 523a, the resistor 523b, an operational amplifier 521, and a resistor 522 of FIG. 5(b). The analog adder 530 adds the voltage signals from the IV amplifiers 520a and 520b. The addition in the analog adder 530 is performed with a weight corresponding to the values of the resistor 523a, the resistor 523b, and the resistor 522. That is, weighted addition is performed on the voltage signals from the IV amplifiers 520a and 520b.

The analog-to-digital converter 540 converts the analog addition signal input from the analog adder 530 into a digital signal. The converted digital signal is output to the processor 550 as data.

The processor 550 digitally corrects the data acquired from the analog-to-digital converter 540 using calibration data acquired in advance. Since the signal added by the analog adder 530 is a distorted signal having an inflection point (described later), linearity is recovered by digital correction. The fluorescence input to the light receiving unit is analyzed using the corrected data, and information regarding the fluorescence (for example, intensity or intensity distribution of the fluorescence) is acquired.

Figure 6:
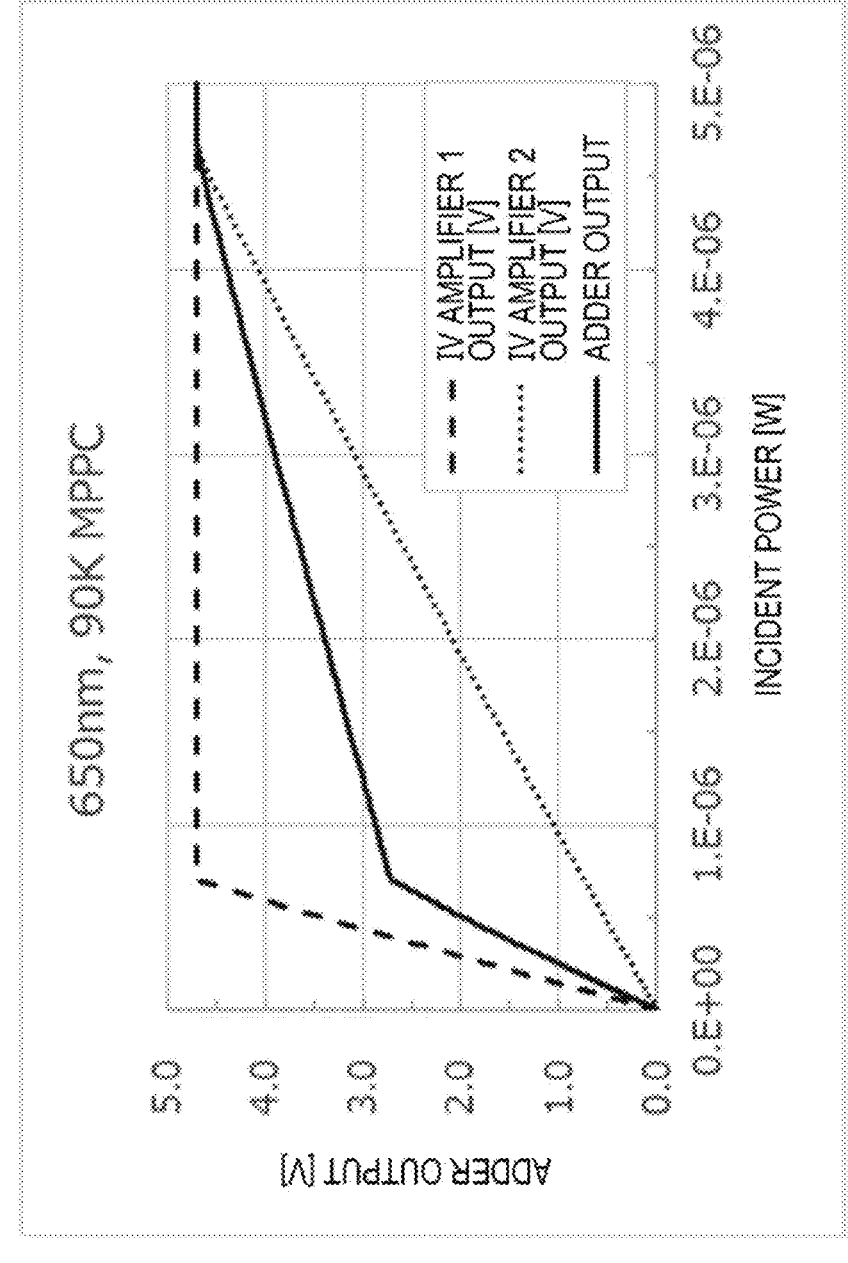
FIG. 6 is a graph illustrating output characteristics of an analog adder.

FIG. 6 is a graph illustrating output characteristics of the analog adder 530. A graph of an output of an IV amplifier 1 indicates an output voltage of the IV amplifier 520a, and a graph of an output of an IV amplifier 2 indicates an output voltage of the IV amplifier 520b. A graph of an adder output indicates a voltage obtained by adding the output voltage of the IV amplifier 520a and the output voltage of the IV amplifier 520b with the same weight. In this example, both weights are the same, and the graph of the adder output indicates an average voltage of the output voltage of the IV amplifier 520a and the output voltage of the IV amplifier 520b.

An output of the analog adder 530 is $V_{out}$. In the IV amplifier 520a, a resistance value of the resistor 522a is $R_{IV1}$, a resistance value of the resistor 523a is $R_{A1}$, and an output current is $I_1$. In the IV amplifier 520b, a resistance value of the resistor 522b is $R_{IV2}$, a resistance value of the resistor 523b is $R_{A2}$, and an output current is $I_2$. Furthermore, a resistance value of the resistor 522 in the analog adder 530 is referred to as RAF. At this time, the following Formula (1) is established.

[Mathematical formula 1]

$$V_{OUT} = \left( I_1 \frac{R_{IV1}}{R_{A1}} + I_2 \frac{R_{IV2}}{R_{A2}} + \dots \right) R_{AF} \tag{1}$$

In particular, when $R_{IV1}=R_{IV2}=R_{IV}$ and $R_{A1}=R_{A2}=R_A$ hold, the following Formula (2) holds.

[Mathematical formula 2]

$$V_{OUT} = (I_1 + I_2 + \dots) \frac{R_{IV} R_{AF}}{R_A} \tag{2}$$

From the graph of the output of the IV amplifier 1 in FIG. 6, the light receiving element of the first stage has high detection sensitivity, and the output voltage of the IV amplifier 520a rises with a large gradient with respect to incident power (A gain with respect to the input is large). An output voltage of the IV amplifier 520a is saturated at incident power of a certain value or more.

The light receiving element in the second stage has lower detection sensitivity than the light receiving in the first stage, and the output voltage of the IV amplifier 520a rises with a small gradient with respect to the incident power (A gain with respect to the input is small).

When the output voltage from the first-stage IV amplifier 520a reaches a saturation state, thereafter, only an output voltage from the second-stage IV amplifier 520b contributes to output characteristics. Therefore, in the graph of the adder output, an inflection point P1 appears when the output voltage from the first-stage IV amplifier 520a reaches the saturation state. At incident power greater than the inflection point P1, the gradient of the graph of the adder output decreases.

on the basis of such a graph of the adder output, the processor 550 can determine the optical power incident on the light receiving unit on the basis of a value of the output voltage of the analog adder even in a case where the light having the power at which the light receiving element of the first stage reaches the saturation state is incident. At this time, the incident optical power can be determined with higher accuracy by performing correction using the above-described calibration data to restore the linearity of the graph.

By using the plurality of light receiving elements in this manner, sensitivity can be enhanced as compared with a case where a single light receiving element is used. Since an additional circuit is unnecessary in the processing after the analog adder, the dynamic range can be extended at low cost.

Figure 7:
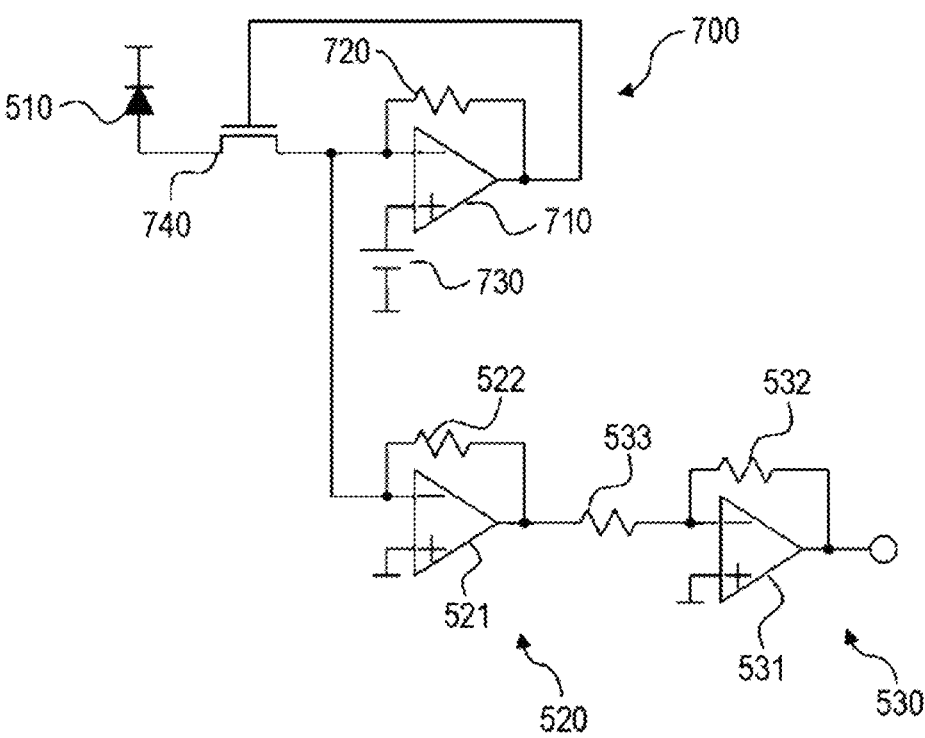
FIG. 7 is a circuit diagram illustrating a protection circuit.

FIG. 7 is a circuit diagram in which a protection circuit 700 is added to the circuit of FIG. 5(b). Although FIG. 7 illustrates an example in which a protection circuit is added only to the first-stage IV amplifier, a protection circuit may be similarly added to the second-stage and subsequent IV amplifiers. The same elements as those in FIG. 5 are denoted by the same reference signs, and the description thereof will be omitted.

In a case where the incident light of the light receiving element 510a is unexpectedly strong, a current flowing through the light receiving element also increases. Since a large reverse voltage is applied to the light receiving element, when a large current flows, heat generation in the element also increases, and the element may be thermally damaged. In a case where excessive light is input to the light receiving element 510a, the protection circuit 700 protects the light receiving element by limiting a current flowing to the IV amplifier 520a.

The protection circuit 700 includes, for example, an operational amplifier 710, a resistor 720, a DC power supply 730, and an n-type field effect transistor (FET) 740. The light receiving element 510a is connected to a drain terminal of the FET 740, and a gate terminal of the FET 740 is connected to an output terminal of the operational amplifier 710.

Furthermore, a source terminal of the FET 740 is connected to an inverting input terminal of the operational amplifier 710 and the IV amplifier 520a. The resistor 720 is connected between the inverting input terminal and the output terminal of the operational amplifier 710. Furthermore, the DC power supply 730 is connected to a non-inverting input terminal of the operational amplifier 710.

Therefore, when an input current from the light receiving element 510a increases, the IV amplifier 520 is saturated and the feedback thereof does not normally function, and a voltage of the inverting input terminal of the operational amplifier 710 increases, the operational amplifier 710 operates to decrease a reverse voltage applied to the light receiving element by decreasing a gate voltage of the FET 740 and increasing an ON resistance of the FET 740. As a result, the photoelectric conversion sensitivity of the light receiving element can be reduced, and an excessive current can be prevented from flowing through the light receiving element.

Figure 8:
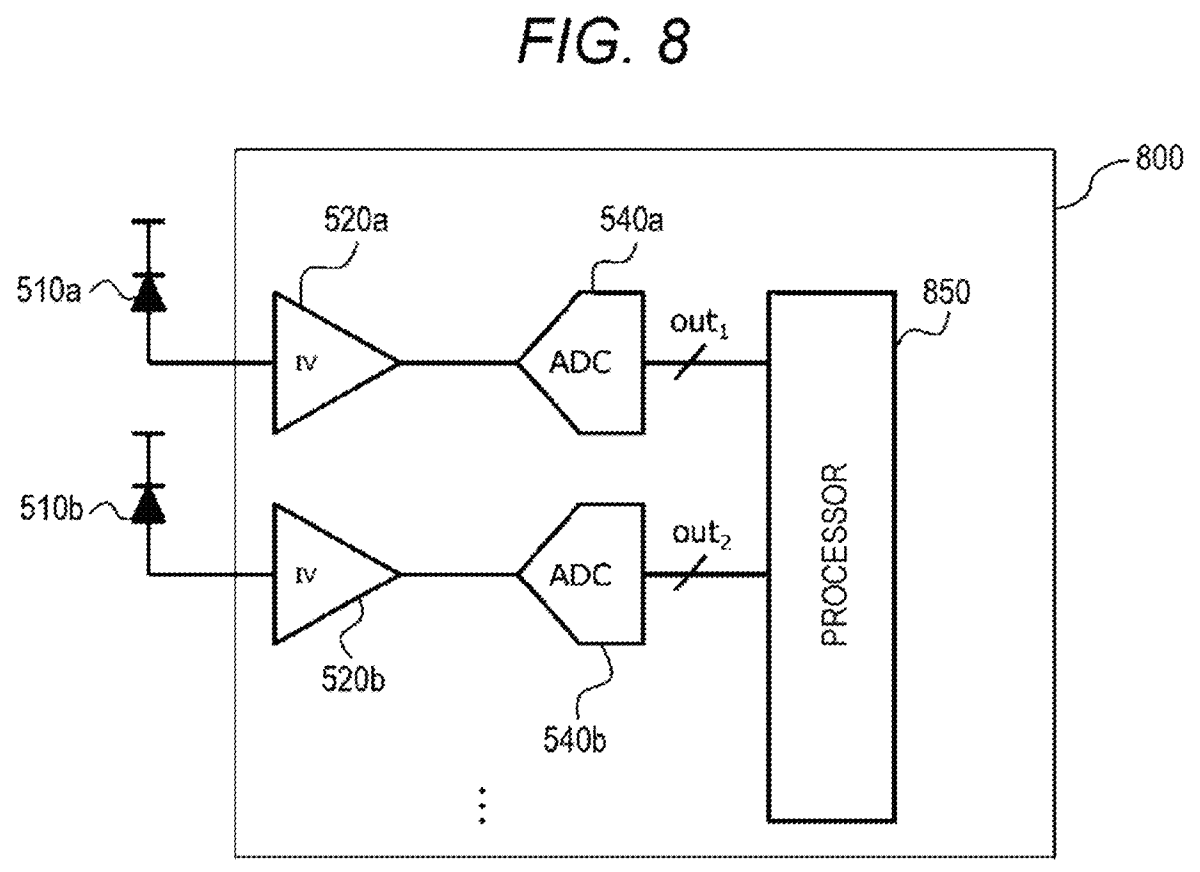

FIG. 8 is a block diagram illustrating a second example (digital addition method) of the processing circuit (information processing unit) in the flow cytometer 100 according to the embodiment of the present disclosure. A processing circuit 800 digitally adds up the detection signals in the plurality of light receiving elements, and processes the added signal to acquire information regarding the incident light on the light receiving unit 300 (see FIG. 2).

Currents output from the light receiving elements 310a and 310b are converted into voltage signals (analog signals) by the IV amplifiers 520a and 520b, and the voltage signals from the IV amplifiers 520a and 520b are converted into digital signals by the analog-to-digital converters 540a and 540b. The processor 850 adds the digital signals from the analog-to-digital converters 540a and 540b. The processor 850 may correct the added digital signal using calibration data acquired in advance.

At this time, the addition of the digital signals is performed by a predetermined algorithm. For example, when reflectance of the n-th light receiving element 310n is $R_n$ and a digital signal (voltage value) output from the digital-to-analog converter corresponding to the n-th light receiving element 310n is $Out_n$, the addition of the digital signals is expressed by the following Formula (3). The reflectance is previously measured and determined.

[Mathematical formula 3]

$$out = out_1 + \frac{1}{R_1} \, out_2 + \frac{1}{R_1 R_2} \, out_3 + \ldots \quad (3)$$

In the addition of the digital signals in the processor 850, each digital signal may be multiplied by a weight and added. The weights of the respective digital signals may be the same or different. For example, the weight of the digital signal of the analog-to-digital converter of the light receiving element having a low number of stages may be larger or smaller than the weight of the digital signal of the analog-to-digital converter of the light receiving element having a high number of stages.

The configuration of the digital addition illustrated in FIG. 8 can also obtain the similar effect to the configuration of the analog addition illustrated in FIG. 5 or 7. Moreover, in the configuration of the digital addition, since all the analog DR (dynamic range) can be used in the analog signals of the respective stages by the respective analog-to-digital converters, it is possible to perform measurement with higher accuracy than performing AD conversion on the added signals as in the analog addition method.

Figure 9:
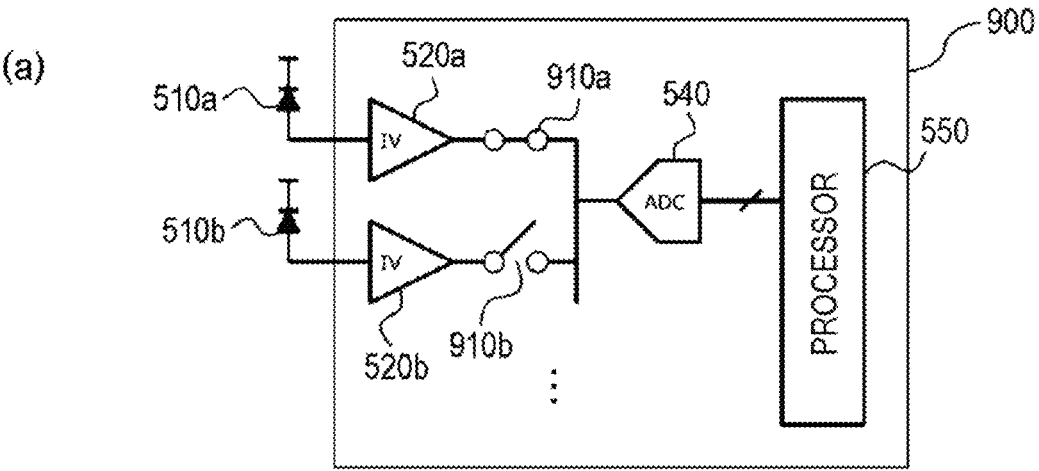
FIG. 9 is a block diagram illustrating still another example of the processing circuit according to the embodiment of the present disclosure.
Figure 9:
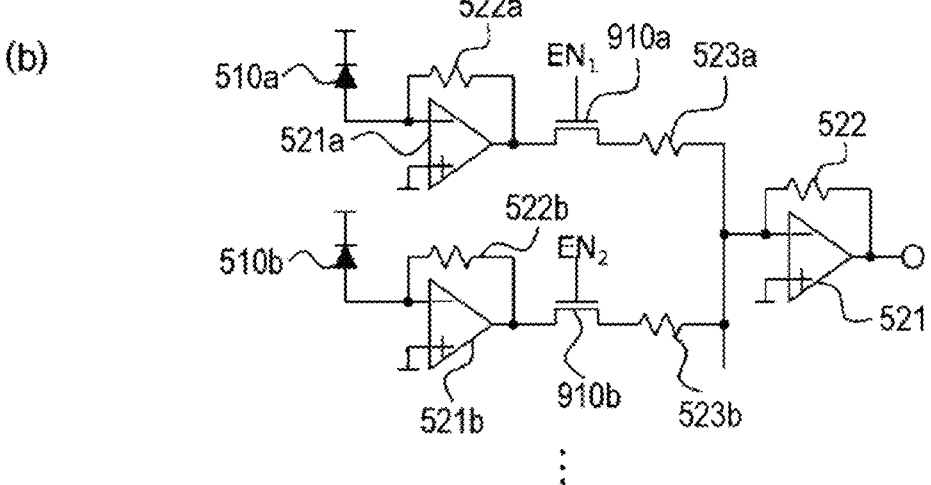

FIG. 9(a) is a block diagram illustrating a third example (analog switching method) of the processing circuit (information processing unit) in the flow cytometer 100 according to the embodiment of the present disclosure. A difference from the configuration of FIG. 5(a) is that switches 910a and 910b are added and the analog adder 530 is not provided. FIG. 9(b) is a circuit diagram from the light receiving elements 510a and 510b to before the analog-to-digital converter 540 in FIG. 9(a). In FIG. 9, the same parts as those in FIGS. 5(a) and 5(b) are denoted by the same reference signs, and a detailed description thereof will be omitted.

In FIG. 9(a), the switch 910a connects the IV amplifier 520a and the analog-to-digital converter 540. The switch 910b connects the IV amplifier 520b and the analog-to-digital converter 540. As illustrated in FIG. 9(b), the switches 910a and 910b are configured by n-type FETs. The switches 910a and 910b are turned on or off according to instruction signals $EN_1$ and $EN_2$ from the outside. The instruction signals $EN_1$ and $EN_2$ may be input from an operation device connected to the outside on the basis of an operation of an operator, or may be input from the processor 550. The light receiving element to be used can be designated by the instruction signals.

Only an output signal (voltage signal) from the IV amplifier of the stage in which the switch is turned on is input to the analog-to-digital converter 540. The analog-to-digital converter 540 converts the input voltage signal into a digital signal, and outputs the digital signal to the processor 550.

In a case where the maximum value of the incident light amount desired to be detected by the light receiving unit is known, by selecting a light receiving element at a stage that is not saturated with the maximum incident light amount, information regarding the incident light can be acquired with high accuracy using only a signal from a single light receiving element. In the configuration of FIG. 9(a), since the addition of the signal as in the case of the analog addition or the digital addition described above is unnecessary, it is possible to omit the processor 550 from calibrating the digital signal. In the application in which the dynamic range is only required to be selected according to the incident light amount desired to be detected, calibration is unnecessary in this manner, so that the application can be developed at low cost.

As a modification example of the configuration of FIGS. 9(a) and 9(b), a plurality of the switches may be turned on. In this case, the voltage signals from the plurality of IV amplifiers may be combined and input to the analog-to-digital converter 540.

In the configurations of FIGS. 9(a) and 9(b), the switch is arranged at the subsequent stage of the IV amplifier, but a configuration in which the switch is arranged at the preceding stage of the IV amplifier is also possible.

Figure 10:
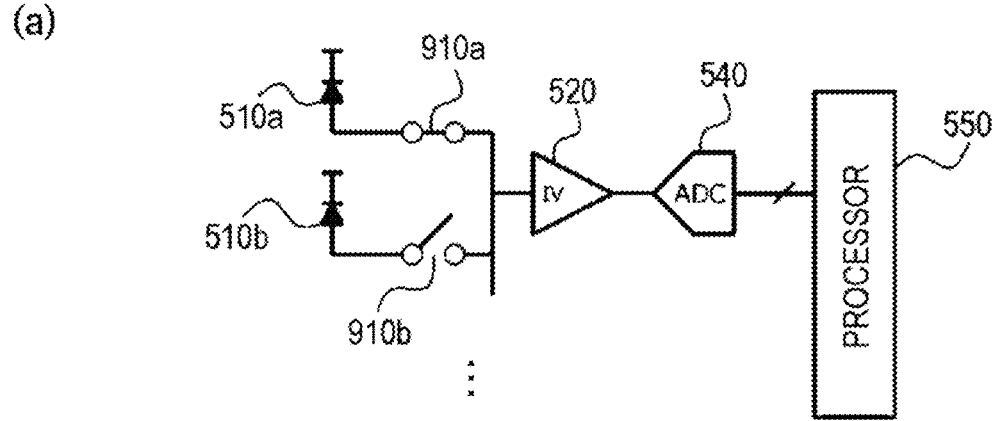
FIG. 10 is a diagram illustrating a modification example of the configuration of FIG. 9.
Figure 10:
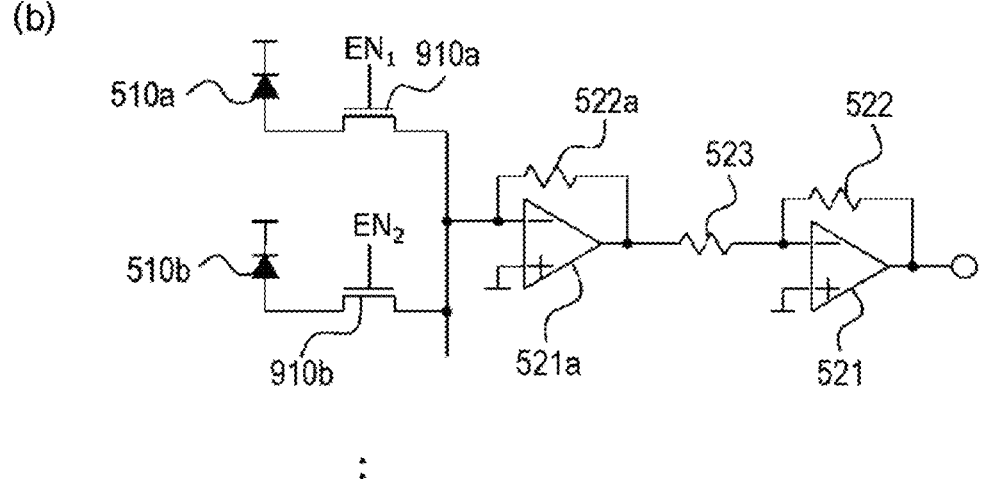

FIG. 10($a$) illustrates an example in which the switch is disposed before the IV amplifier. FIG. 10($b$) is a circuit diagram of a part from the light receiving elements 510$a$ and 510$b$ to the IV amplifier in FIG. 10($a$). The same components as those in FIGS. 9($a$) and 9($b$) are denoted by the same reference signs, and the description thereof will be omitted.

Switches 910$a$ and 910$b$ are connected between the light receiving elements 510$a$ and 510$b$ and the IV amplifier 520. The IV amplifier 520 is commonly used for the light receiving elements 510$a$ and 510$b$. In a case where it is desired to use the light receiving element 510$a$, the switch 910$a$ is closed, and the switch 910$b$ is opened. In a case where it is desired to use the light receiving element 510$b$, the switch 910$a$ is opened and the switch 910$b$ is closed.

According to the configurations of FIGS. 10($a$) and 10($b$), the similar effects to those of the configurations of FIGS. 9($a$) and 9($b$) can be obtained. Furthermore, since only one IV amplifier is required, the circuit area can be reduced.

Figure 11:
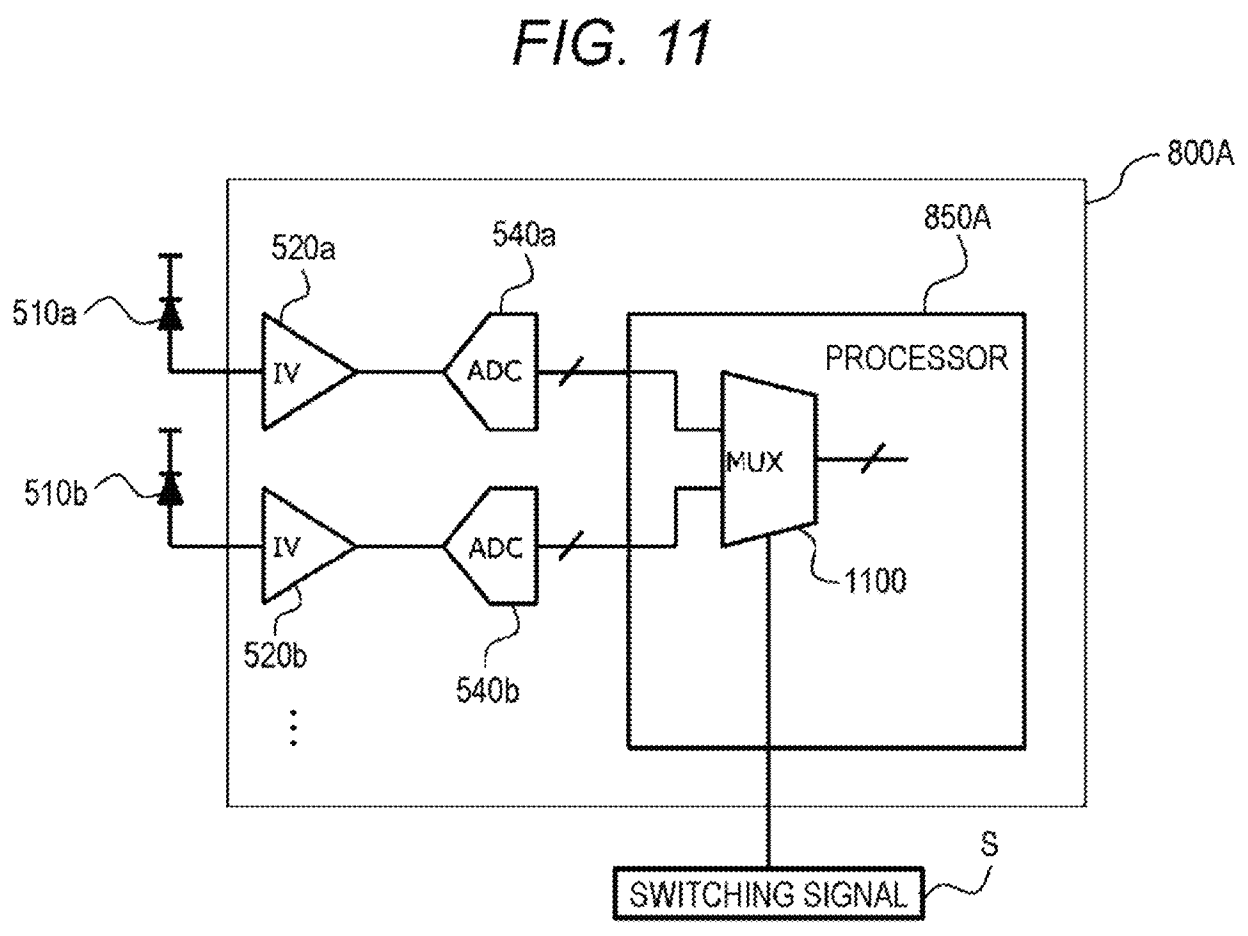

FIG. 11 is a block diagram illustrating a fourth example (digital switching system) of the processing circuit (information processing unit) in the flow cytometer 100 according to the embodiment of the present disclosure. A function of the processor in the configuration illustrated in FIG. 8($a$) is changed. A processing circuit 800A in FIG. 11 includes a processor 850A, and the processor 850A includes a multiplexer 1100.

A plurality of input terminals of the multiplexer 1100 is connected to output terminals of the analog-to-digital converters 540$a$ and 540$b$. The multiplexer 1100 selects one of the digital signals from the analog-to-digital converters 540$a$ and 540$b$ according to a switching signal S input from the outside, and provides the selected digital signal to a process (for example, an application) in a subsequent stage in the processor 850A. The switching signal S corresponds to an instruction signal indicating which of the digital signals from the analog-to-digital converters 540$a$ and 540$b$ is selected.

Next, a mounting example of the light receiving element in the detection unit 300 according to the embodiment of the present disclosure will be described.

Figure 12:
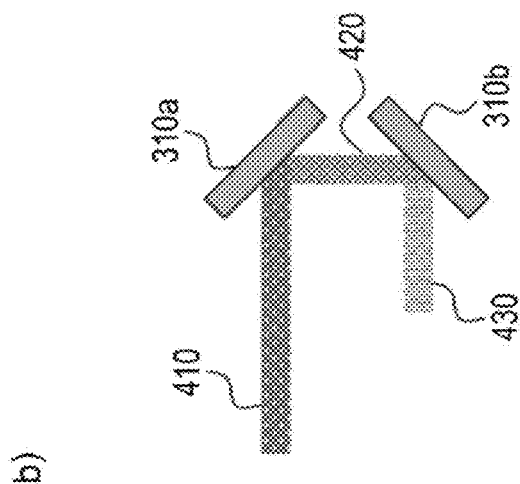
FIG. 12 is a view illustrating a mounting example of the light receiving element according to the embodiment of the present disclosure.
Figure 12:
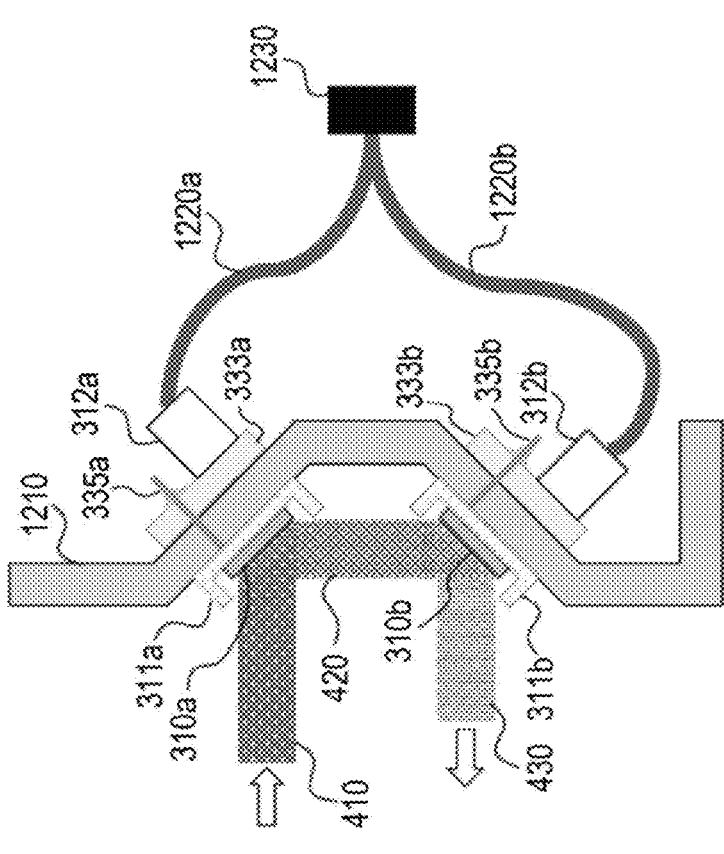

FIG. 12($a$) illustrates a mounting example of the light receiving element in the detection unit 300 according to the embodiment of the present disclosure. A mounting example of a two-stage configuration using two light receiving elements will be described. FIG. 12($b$) illustrates two light receiving elements 310$a$ and 310$b$ in FIG. 12($a$) taken out while maintaining the positional relationship.

The light receiving element 310$a$ detects the incident light 410. A part of the incident light 410 is reflected, and the reflected light 420 is incident on the light receiving element 310$b$. The light receiving element 310$b$ detects the reflected light 420, and a part of the reflected light 420 is reflected as the reflected light 430.

The light receiving element 310$a$ is provided in a ceramic package 311$a$, and the light receiving element 310$b$ is provided in a ceramic package 311$b$. The ceramic packages 311$a$ and 311$b$ are attached to one surface of the heat sink 1210. Substrates 333$a$ and 333$b$ are provided on an opposite surface of the heat sink 1210.

The ceramic package 311$a$ is electrically connected to the substrate 333$a$ by a terminal 335$a$. It is desirable that a hole through which the terminal 335$a$ passes is opened in the base part 1210 having a heat dissipation function. Similarly, the ceramic package 311$b$ is electrically connected to the substrate 333$b$ by the terminal 335$b$. It is desirable that a hole through which the terminal 335$b$ passes is opened in the base part 1210.

A connector 312$a$ is connected to a surface of the substrate 333$a$, and provides a detection signal (current signal) input from the light receiving element 310$a$ to a processing circuit 1230 through a harness 1220$a$. A connector 312$b$ is connected to a surface of the substrate 333$b$, and provides a detection signal (current signal) input from the light receiving element 310$b$ to the processing circuit 1230 through a harness 1220$b$.

The processing circuit 1230 is the processing circuit according to the embodiment of the present disclosure described above. As an example, the processing circuit 1230 is the processing circuit according to the first to fourth examples described above.

Figure 13:
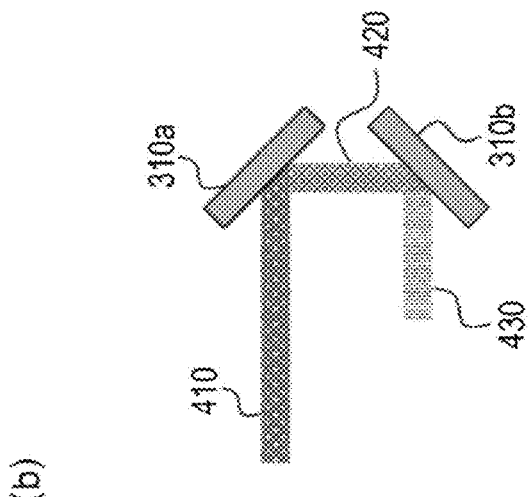
FIG. 13 is a view illustrating another mounting example of the light receiving element according to the embodiment of the present disclosure.
Figure 13:
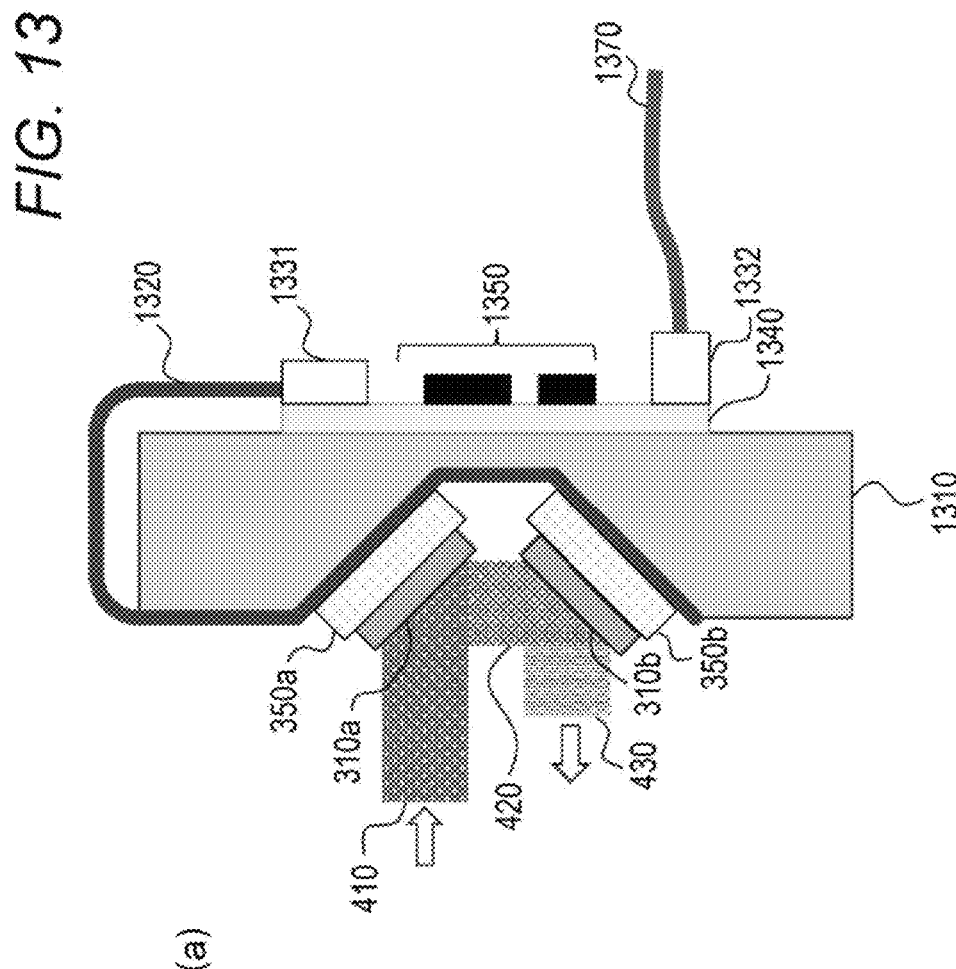

FIG. 13($a$) illustrates another mounting example of the light receiving element in the detection unit 300 according to the embodiment of the present disclosure. FIG. 13($b$) illustrates two light receiving elements 310$a$ and 310$b$ in FIG. 13($a$) taken out while maintaining the positional relationship. FIG. 13($b$) is the same as FIG. 12($b$). In FIG. 13($a$), the same components as those in FIG. 12($a$) are denoted by the same reference signs, and the description thereof will be omitted as appropriate.

The light receiving element 310$a$ and the light receiving element 310$b$ are arranged on an FPC 1320 disposed on a base part 1310 having a heat dissipation function via substrates 350$a$ and 350$b$. The light receiving element 310$a$ and the light receiving element 310$b$ are electrically connected to the FPC 1320 via the substrates 350$a$ and 350$b$. The FPC 1320 is a flexible printed circuit board and has electric wiring. The FPC 1320 is connected to a substrate 1340 through a connector 1331. The substrate 1340 is connected to a processing circuit (not illustrated) through a connector 1332 and a harness 1370.

Signals output from the light receiving element 310$a$ and the light receiving element 310$b$ are supplied to a first circuit 1350 in the processing circuit via the connector 1331 and the substrate 1340. The first circuit 1350 includes a part of the processing circuit in the first to fourth examples described above. The first circuit 1350 may be, for example, the IV amplifier or the analog adder in the first example, or the IV amplifier and the switch in the third example.

An output signal from the first circuit 1350 is output to a second circuit (not illustrated) in the processing circuit via the substrate 1340, the connector 1322, and the harness 1370. The second circuit includes, for example, the remaining part of the processing circuit in the first to fourth examples described above. For example, the second circuit may be the analog-to-digital converter and the processor in the first example or the second example described above. An analog-to-digital converter may be included in the first circuit 1350.

Next, the operation of the flow cytometer 100 in FIG. 2 will be described using a flowchart.

Figure 14:
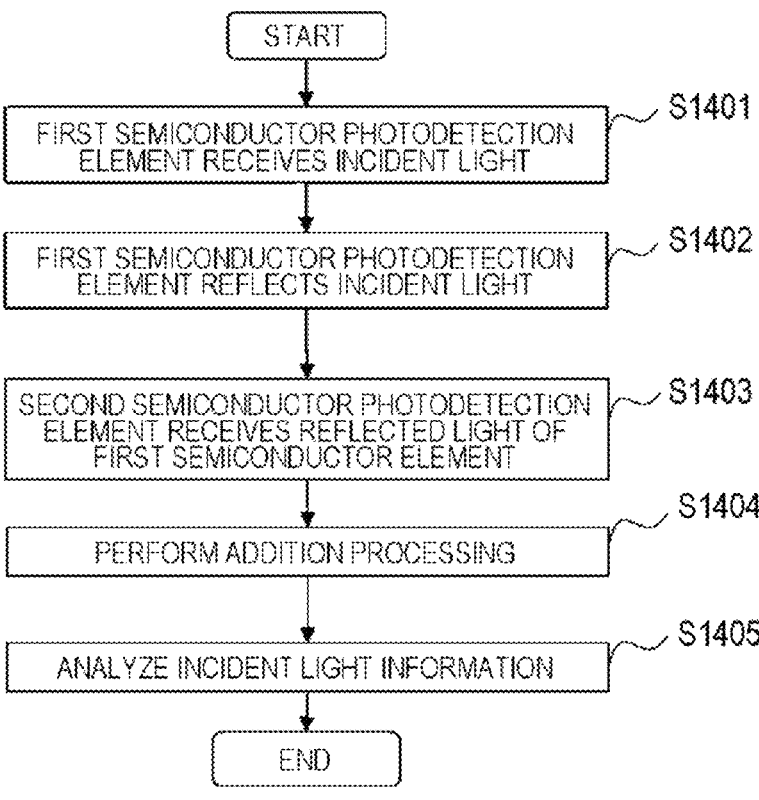
FIG. 14 is a flowchart of an example of an operation of the flow cytometer according to the embodiment of the present disclosure.

FIG. 14 is a flowchart of an example of the operation of the flow cytometer 100 according to the embodiment of the present disclosure. Here, it is assumed that two light receiving elements in the light receiving unit 300 are arranged. The light receiving element on which incident light is first incident is defined as a first semiconductor photodetection element. The light receiving element that receives the reflected light reflected by the first-stage light receiving element is defined as a second semiconductor photodetection element.

Laser light is emitted from the light irradiation unit 110, and incident light is generated by irradiating the biological particle with light.

The first semiconductor photodetection element receives incident light (S1401). The first semiconductor photodetection element outputs a signal corresponding to the detected light. Next, a part of the incident light is reflected by the first semiconductor photodetection element (S1402).

Next, the second semiconductor photodetection element receives the reflected light of the first semiconductor photodetection element (S1403). The second semiconductor photodetection element outputs a signal corresponding to the detected light.

The processing circuit of the flow cytometer 100 adds the signals from the first semiconductor element and the second semiconductor element (S1404).

Next, the processing circuit of the flow cytometer 100 analyzes the converted information (S1405). For example, information (for example, light intensity) regarding light incident on the first semiconductor photodetection element is calculated.

As described above, according to the present embodiment, the light receiving element in the subsequent stage detects the reflected light reflected by the light receiving element in the preceding stage, and the information regarding the incident light can be detected with high accuracy regardless of the intensity of the light by using the detection signal of the light receiving element in the preceding stage and the detection signal of the light receiving element in the subsequent stage. As a result, the dynamic range can be extended without increasing the chip area of the light receiving element.

For example, a sample in which dark particles and bright particles are mixed can be measured with high sensitivity (corresponding to dark particles) and a wide dynamic range (corresponding to bright particles). In particular, in the case of the digital addition method, data of a wide dynamic range can be acquired and stored, so that correct measurement can be performed without optimizing the gain setting for each light receiving element for each measurement. That is, dark particles are not seen due to insufficient sensitivity, and bright particles are not saturated.

In the above-described embodiment, the shape of the incident light 410 on the light receiving unit or the irradiation light from the irradiation unit may be flat. As a result, the irradiated element area can be increased, and the dynamic range can be widened.

Furthermore, the flow cytometer 100 according to the embodiments of the present disclosure is an analyzer that mainly analyzes a biological sample, but may be used as a sorter by combining the sorting unit 6104.

In the above-described embodiments, an example of measuring the fluorescence has been described, but the reception unit and the processing circuit according to the present embodiments may be used to measure any of forward scattered light, backscattered light, and side scattered light.

The steps of the processes disclosed in the present specification may not necessarily be performed in the order described in the flowchart. For example, the steps may be executed in an order different from the order described in the flowchart, or some of the steps described in the flowchart may be executed in parallel.

MODIFICATION EXAMPLES

In the embodiments described above, the arrangement example of the light receiving elements in which the light reflected by the light receiving element in the subsequent stage does not return to the light receiving element in the preceding stage has been described, but an arrangement in which the light reflected by the light receiving element in the subsequent stage returns to the light receiving element in the preceding stage is not excluded.

Figure 15:
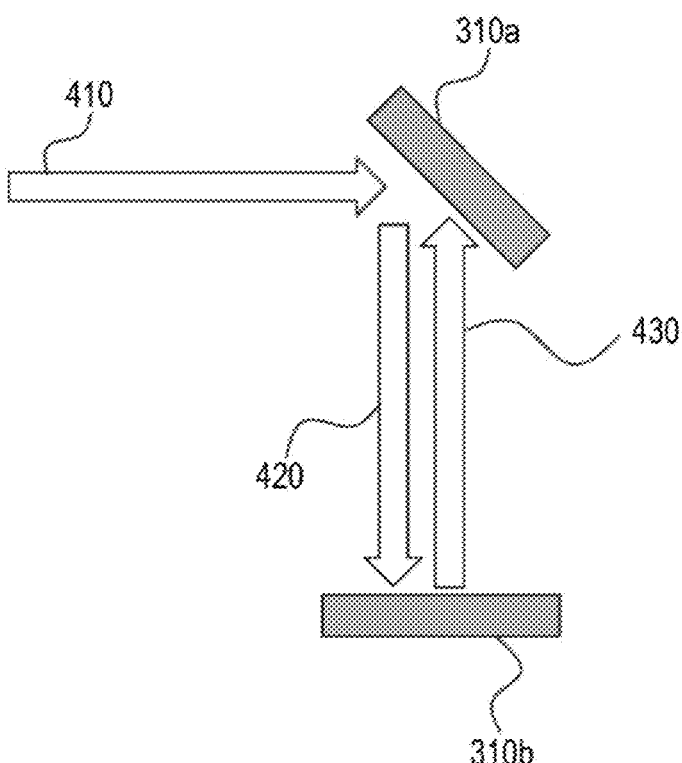
FIG. 15 is a diagram of a modification example of an arrangement of a semiconductor photodetector according to the embodiment of the present disclosure.

FIG. 15 illustrates an arrangement example in which light reflected by the light receiving element in the subsequent stage returns to the light receiving element in the preceding stage. The incident light 410 is incident on the light receiving element 310a, and a part of the incident light 410 is reflected. The reflected light 420 from the light receiving element 310a enters the light receiving element 310b. An incident surface of the light receiving element 310b is perpendicular to the incident light. Therefore, a part of the light incident on the light receiving element 310b is reflected to the light receiving element 310a, and this reflected light (reflected light 430) is incident on the light receiving element 310a. That is, the reflected light 430 is incident on the light receiving element 310a in addition to the incident light 410.

For example, since the light receiving element at the last stage does not have any further light receiving element, there is no problem even if the incident light is reflected to the light receiving element at the previous stage. In a case where the light receiving element in the preceding stage is not saturated, the measurement accuracy can be expected to be improved by additionally detecting the re-incident light. Furthermore, when the light receiving element in the preceding stage (here, the light receiving element 310a) is already saturated, even if the reflected light 430 from the light receiving element 310b is additionally incident on the light receiving element 310a, the signal detected by the light receiving element 310a is not affected (there is no change).

Note that the present invention is not limited to the embodiments described above as they are, and can be embodied by modifying the constituent elements without departing from the gist thereof in the implementation stage. Furthermore, various inventions can be formed by appropriately combining the plurality of constituent elements disclosed in the embodiments described above. For example, some components may be deleted from all the components illustrated in the embodiments. Moreover, the components of different embodiments may be appropriately combined.

Furthermore, the effects of the present disclosure described in the present description are merely exemplification, and other effects may be provided.

Note that the present disclosure can have the following configurations.

Item 1

A biological sample analyzer including:

a first semiconductor photodetection element that detects first light generated by irradiation of a biological sample and generates a first signal;

a second semiconductor photodetection element that detects second light reflected by the first semiconductor photodetection element among the first light and generates a second signal; and a processing circuit that acquires information regarding the first light on the basis of the first signal and the second signal.

Item 2

The biological sample analyzer according to item 1, in which the processing circuit adds the first signal and the second signal, and acquires information regarding the first light on the basis of a signal obtained by adding the first signal and the second signal.

Item 3

The biological sample analyzer according to item 2, in which
the processing circuit converts a signal obtained by adding the first signal and the second signal into a digital signal, and acquires information regarding the first light on the basis of the converted digital signal.

Item 4

The biological sample analyzer according to item 2, in which
the processing circuit selects one of the first signal and the second signal, and acquires information regarding the first light on the basis of the selected signal.

Item 5

The biological sample analyzer according to item 4, in which
the processing circuit selects one of the first signal and the second signal on the basis of an instruction signal indicating which of the first signal and the second signal is selected.

Item 6

The biological sample analyzer according to item 2 or 3, in which
the processing circuit weights the first signal and the second signal, and adds the weighted first signal and second signal.

Item 7

The biological sample analyzer according to item 1, in which
the processing circuit converts the first signal into a first digital signal, converts the second signal into a second digital signal, adds the first digital signal and the second digital signal, and acquires information regarding the first light on the basis of a signal obtained by adding the first digital signal and the second digital signal.

Item 8

The biological sample analyzer according to item 7, in which
the processing circuit selects one of the first digital signal and the second digital signal, and acquires information regarding the first light on the basis of the selected digital signal.

Item 9

The biological sample analyzer according to item 8, in which the processing circuit selects one of the first digital signal and the second digital signal on the basis of an instruction signal indicating which of the first signal and the second signal is selected.

Item 10

The biological sample analyzer according to item 7, in which
the processing circuit weights the first digital signal and the second digital signal, and adds the weighted first digital signal and second digital signal.

Item 11

The biological sample analyzer according to any one of items 1 to 10, further including:
a first amplifier that receives the first signal that is a current signal and converts the first signal into a first voltage signal; and
a second amplifier that receives the second signal that is a current signal and converts the second signal into a second voltage signal,
in which the processing circuit acquires information regarding the first light on the basis of the first voltage signal and the second voltage signal, and
includes a first protection circuit that controls a current flowing through the first amplifier on the basis of the first signal.

Item 12

The biological sample analyzer according to any one of items 1 to 11, in which
an aperture ratio of the first semiconductor photodetection element is higher than an aperture ratio of the second semiconductor photodetection element, and
a number of pixels of the first semiconductor photodetection element is less than a number of pixels of the second semiconductor photodetection element.

Item 13

The biological sample analyzer according to any one of items 1 to 12, in which
the first semiconductor photodetection element reflects a part of the first light in a direction non-parallel to a direction in which the first light is incident.

Item 14

The biological sample analyzer according to item 13, in which
the second semiconductor photodetection element reflects a part of the second light in a direction non-parallel to a direction in which the second light is incident.

Item 15

The biological sample analyzer according to item 13, in which
an incident surface of the second light on the second semiconductor photodetection element is perpendicular to an incident direction of the second light.

Item 16

The biological sample analyzer according to any one of items 1 to 15, in which
the first semiconductor photodetection element or the second semiconductor photodetection element is a circuit in which avalanche photodiodes are arranged in a matrix or an avalanche photodiode element.

Item 17

The biological sample analyzer according to any one of items 1 to 16, in which
light with which the biological sample is irradiated is flat.

Item 18

The biological sample analyzer according to any one of items 1 to 17, in which
the processing circuit calculates intensity of the first light as the information regarding the first light.

Item 19

A biological sample analysis method including:
irradiating a biological sample with light;
detecting, by a first semiconductor photodetection element, first light generated by irradiation of the biological sample with the light, and generating a first signal;
detecting, by a second semiconductor photodetection element, second light reflected by the first semiconductor photodetection element among the first light, and generating a second signal; and
acquiring information regarding the first light on the basis of the first signal and the second signal.

Item 20

A flow cytometer including:
an irradiation unit that irradiates a biological sample with light;
a first semiconductor photodetection element that detects first light generated by irradiation of the biological sample with the light, and generates a first signal;
a second semiconductor photodetection element that detects second light reflected by the first semiconductor photodetection element among the first light, and generates a second signal; and
a processing circuit that acquires information regarding the first light on the basis of the first signal and the second signal.

REFERENCE SIGNS LIST

100 Flow cytometer
110, 6101 Light irradiation unit
111 Laser diode
112 Lens
113 Laser light
120 Scattered light detection unit
121 Photodiode
122 Lens
123 Optical mask
124 Forward scattered light
130 Flow cell
200 Fluorescence detection unit
210 Lens
220 LPF
220a, 220b, 220c BPF
231, 232 Dichroic mirror
240 Mirror
250 Fluorescence
300, 300a, 300b, 300c, 300d Light receiving unit 310, 310a, 310b, 310c, 310d Light receiving element
311a, 311b Ceramic substrate
312a, 312b Connector
320 Light detection channel
321 Protective film
322 Light detection layer
323 Metal wiring
324 Polyresistance
331 Semiconductor substrate
332 Separation unit
333a, 333b Substrate
335a, 335b Pin
410 Incident light
420, 430, 440, 450 Reflected light
500, 800, 800a, 900 Processing circuit
510, 510a, 510b Diode
520, 520a, 520b IV amplifier
521, 531, 710 Operational amplifier
522, 522a, 522b, 523a, 523b, 532, 720 Resistor
530 Analog adder
540 Analog to digital converter
550, 850, 850A Processor
700 Protection circuit
730 DC power supply
740 FET
910a 910b Switch
1100 Multiplexer
1210, 1320 FPC
1220a, 1220b, 1370 Harness
1230 Processing circuit
1331, 1332 Connector
1340 Substrate
1350, 1360 First circuit
6100 Biological sample analyzer (flow cytometer)
6202 Detection unit
6103 Information processing unit
6104 Sorting unit

The invention claimed is:
1. A biological sample analyzer comprising:
a first semiconductor photodetection element that detects first light generated by irradiation of a biological sample and generates a first signal;
a second semiconductor photodetection element that detects second light reflected by the first semiconductor photodetection element among the first light and generates a second signal; and
a processing circuit that acquires information regarding the first light on a basis of the first signal and the second signal, wherein
the processing circuit adds the first signal and the second signal, and acquires information regarding the first light on a basis of a signal obtained by adding the first signal and the second signal.

2. The biological sample analyzer according to claim 1, wherein
the processing circuit converts a signal obtained by adding the first signal and the second signal into a digital signal, and acquires information regarding the first light on a basis of the converted digital signal.

3. The biological sample analyzer according to claim 1, wherein
the processing circuit selects one of the first signal and the second signal, and acquires information regarding the first light on a basis of the selected signal.

4. The biological sample analyzer according to claim 3, wherein the processing circuit selects one of the first signal and the second signal on a basis of an instruction signal indicating which of the first signal and the second signal is selected.

5. The biological sample analyzer according to claim 1, wherein
the processing circuit weights the first signal and the second signal, and adds the weighted first signal and second signal.

6. The biological sample analyzer according to claim 1, wherein
the processing circuit converts the first signal into a first digital signal, converts the second signal into a second digital signal, adds the first digital signal and the second digital signal, and acquires information regarding the first light on a basis of a signal obtained by adding the first digital signal and the second digital signal.

7. The biological sample analyzer according to claim 6, wherein
the processing circuit selects one of the first digital signal and the second digital signal, and acquires information regarding the first light on a basis of the selected digital signal.

8. The biological sample analyzer according to claim 7, wherein the processing circuit selects one of the first digital signal and the second digital signal on a basis of an instruction signal indicating which of the first signal and the second signal is selected.

9. The biological sample analyzer according to claim 6, wherein
the processing circuit weights the first digital signal and the second digital signal, and adds the weighted first digital signal and second digital signal.

10. The biological sample analyzer according to claim 1, further comprising:
a first amplifier that receives the first signal that is a current signal and converts the first signal into a first voltage signal; and
a second amplifier that receives the second signal that is a current signal and converts the second signal into a second voltage signal,
wherein the processing circuit acquires information regarding the first light on a basis of the first voltage signal and the second voltage signal, and
includes a first protection circuit that controls a current flowing through the first amplifier on a basis of the first signal.

11. The biological sample analyzer according to claim 1, wherein
an aperture ratio of the first semiconductor photodetection element is higher than an aperture ratio of the second semiconductor photodetection element, and
a number of pixels of the first semiconductor photodetection element is less than a number of pixels of the second semiconductor photodetection element.

12. The biological sample analyzer according to claim 1, wherein the first semiconductor photodetection element reflects a part of the first light in a direction non-parallel to a direction in which the first light is incident.

13. The biological sample analyzer according to claim 12, wherein
the second semiconductor photodetection element reflects a part of the second light in a direction non-parallel to a direction in which the second light is incident.

14. The biological sample analyzer according to claim 12, wherein
an incident surface of the second light on the second semiconductor photodetection element is perpendicular to an incident direction of the second light.

15. The biological sample analyzer according to claim 1, wherein
the first semiconductor photodetection element or the second semiconductor photodetection element is a circuit in which avalanche photodiodes are arranged in a matrix or an avalanche photodiode element.

16. The biological sample analyzer according to claim 1, wherein
light with which the biological sample is irradiated is flat.

17. The biological sample analyzer according to claim 1, wherein
the processing circuit calculates intensity of the first light as the information regarding the first light.

18. A biological sample analysis method comprising:
irradiating a biological sample with light;
detecting, by a first semiconductor photodetection element, first light generated by irradiation of the biological sample with the light, and generating a first signal;
detecting, by a second semiconductor photodetection element, second light reflected by the first semiconductor photodetection element among the first light, and generating a second signal; and
acquiring information regarding the first light on a basis of the first signal and the second signal, wherein
the first signal and the second signal are added, and information is acquired regarding the first light on a basis of a signal obtained by adding the first signal and the second signal.

19. A flow cytometer comprising:
an irradiation unit that irradiates a biological sample with light;
a first semiconductor photodetection element that detects first light generated by irradiation of the biological sample with the light, and generates a first signal;
a second semiconductor photodetection element that detects second light reflected by the first semiconductor photodetection element among the first light, and generates a second signal; and
a processing circuit that acquires information regarding the first light on a basis of the first signal and the second signal, wherein
the processing circuit adds the first signal and the second signal, and acquires information regarding the first light on a basis of a signal obtained by adding the first signal and the second signal.

* * * * *